(12) United States Patent
Mitani et al.

(10) Patent No.: US 7,883,967 B2
(45) Date of Patent: Feb. 8, 2011

(54) NONVOLATILE SEMICONDUCTOR MEMORY DEVICE, SEMICONDUCTOR DEVICE AND MANUFACTURING METHOD OF NONVOLATILE SEMICONDUCTOR MEMORY DEVICE

(75) Inventors: Yuuichiro Mitani, Miura-gun (JP); Daisuke Matsushita, Hiratsuka (JP); Ryuji Ooba, Kawasaki (JP); Isao Kamioka, Machida (JP); Yoshio Ozawa, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 1065 days.

(21) Appl. No.: 11/491,054

(22) Filed: Jul. 24, 2006

(65) Prior Publication Data
US 2007/0018231 A1    Jan. 25, 2007

(30) Foreign Application Priority Data
Jul. 25, 2005    (JP)    ............................. 2005-214613
Apr. 27, 2006    (JP)    ............................. 2006-123914

(51) Int. Cl.
H01L 21/336    (2006.01)
(52) U.S. Cl. ........................ 438/264; 438/763; 438/791; 257/E21.18; 257/E21.625
(58) Field of Classification Search ................. 438/787, 438/791, 216, 264, 764, FOR. 261, FOR. 394, 438/FOR. 401; 257/E21.179, E21.18, E21.422, 257/E21.625
See application file for complete search history.

(56) References Cited

U.S. PATENT DOCUMENTS

| | | | |
|---|---|---|---|
| 4,789,560 A | | 12/1988 | Yen |
| 4,849,366 A | | 7/1989 | Hsu et al. |
| 6,087,229 A | * | 7/2000 | Aronowitz et al. .......... 438/287 |
| 6,191,445 B1 | * | 2/2001 | Fujiwara ...................... 257/321 |
| 6,221,770 B1 | * | 4/2001 | Hillman et al. ............. 438/680 |
| 6,258,690 B1 | * | 7/2001 | Zenke ......................... 438/396 |
| 6,284,583 B1 | * | 9/2001 | Saida et al. .................. 438/216 |
| 6,297,092 B1 | * | 10/2001 | Rudeck et al. .............. 438/257 |
| 6,413,881 B1 | * | 7/2002 | Aronowitz et al. .......... 438/775 |

(Continued)

FOREIGN PATENT DOCUMENTS

CN    1467851 A    1/2004

(Continued)

OTHER PUBLICATIONS

Notification of the First Office Action issued by the Chinese Patent Office on Oct. 31, 2008, for Chinese Patent Application No. 200610101497.1, and English-language translation thereof.

(Continued)

Primary Examiner—Matthew S Smith
Assistant Examiner—Quovaunda Jefferson
(74) Attorney, Agent, or Firm—Finnegan, Henderson, Farabow, Garrett & Dunner, L.L.P.

(57) ABSTRACT

A nonvolatile semiconductor memory device includes a gate portion formed by laminating a tunnel insulating film, floating gate electrode, inter-poly insulating film and control gate electrode on a semiconductor substrate, and source and drain regions formed on the substrate. The tunnel insulating film has a three-layered structure having a silicon nitride film sandwiched between silicon oxide films. The silicon nitride film is continuous in an in-plane direction and has 3-coordinate nitrogen bonds and at least one of second neighboring atoms of nitrogen is nitrogen.

14 Claims, 23 Drawing Sheets

U.S. PATENT DOCUMENTS

| | | | |
|---|---|---|---|
| 6,706,576 B1 * | 3/2004 | Ngo et al. | 438/197 |
| 2002/0142624 A1 * | 10/2002 | Levy et al. | 438/786 |
| 2003/0201491 A1 * | 10/2003 | Chung | 257/324 |
| 2004/0082198 A1 * | 4/2004 | Nakamura et al. | 438/787 |
| 2004/0228969 A1 * | 11/2004 | Lung et al. | 427/255.37 |
| 2005/0093047 A1 * | 5/2005 | Goda et al. | 257/300 |
| 2006/0198190 A1 | 9/2006 | Lue | |
| 2009/0059676 A1 * | 3/2009 | Lai et al. | 365/185.28 |

FOREIGN PATENT DOCUMENTS

| | | |
|---|---|---|
| CN | 1485891 A | 3/2004 |
| JP | 1-307272 | 12/1989 |
| JP | 8-46065 | 2/1996 |
| JP | 2002-83960 | 3/2002 |
| JP | 2005-197624 | 7/2005 |

OTHER PUBLICATIONS

Lai, H. Y. et al., "Operation Characterization of Flash Memory with Silicon Nitride/Silicon Dioxide Stack Tunnel Dielectric," Japanese Journal of Applied Physics, vol. 44, No. 14, pp. L435-L438, (2005).

* cited by examiner

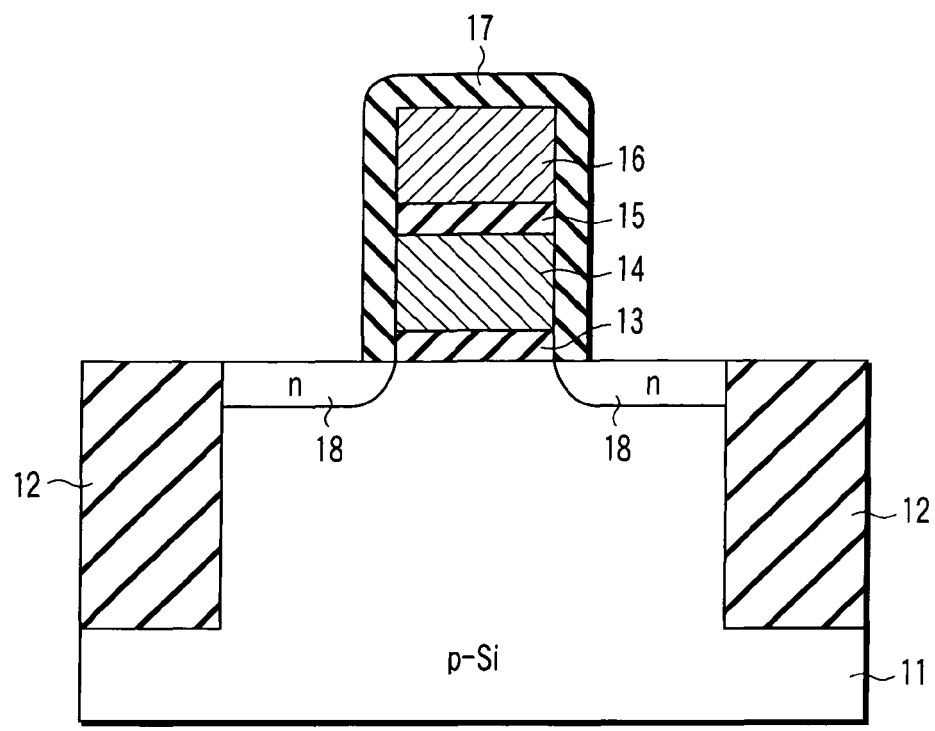
F I G. 1
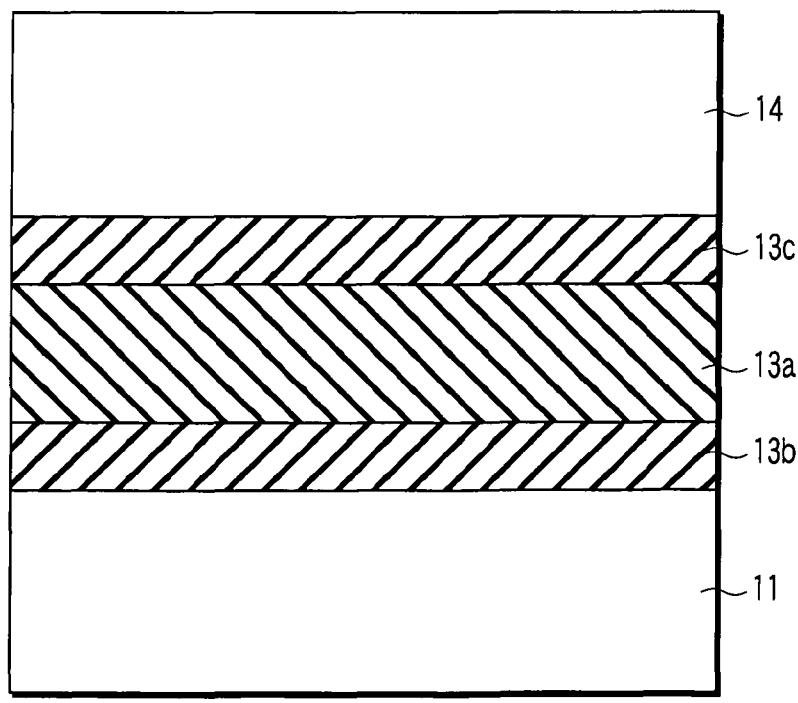
F I G. 2

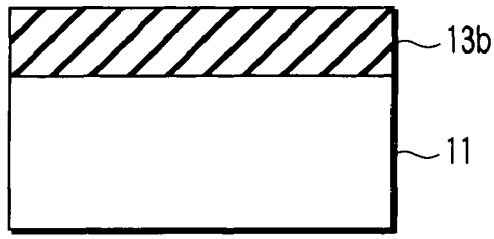
FIG. 4A
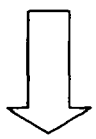
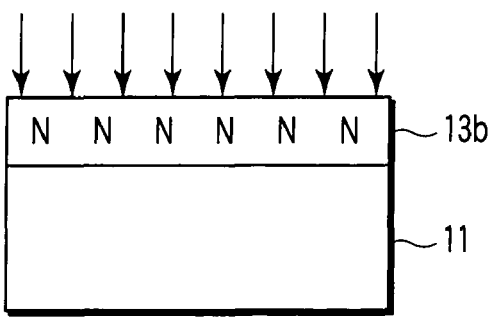
FIG. 4B
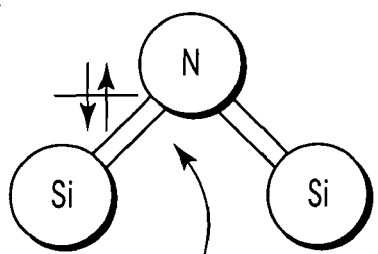
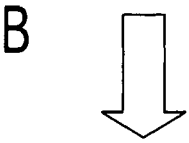
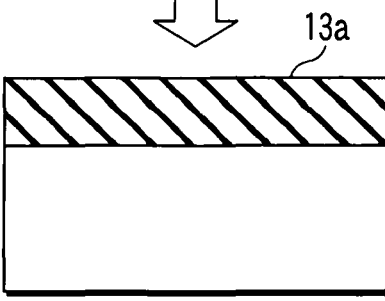
FIG. 4C
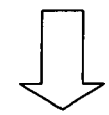
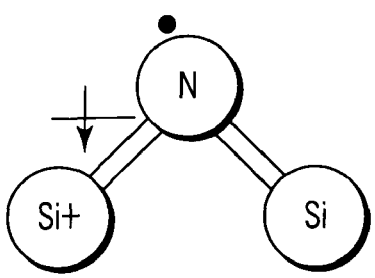

At data retention

At data write/erase

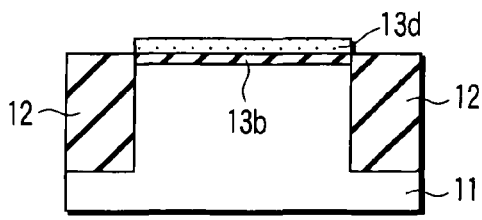
F I G. 16A
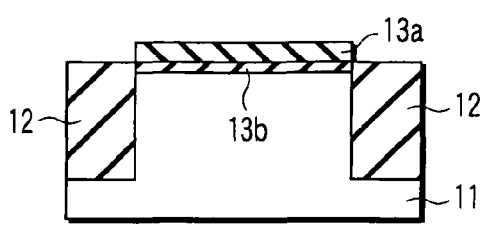
F I G. 16B
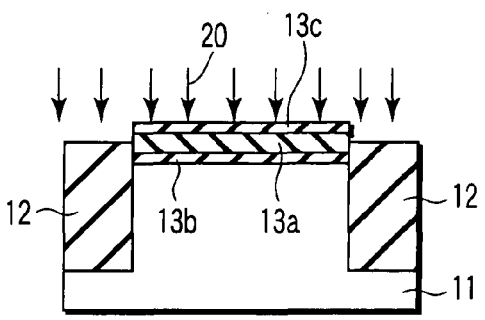
F I G. 16C
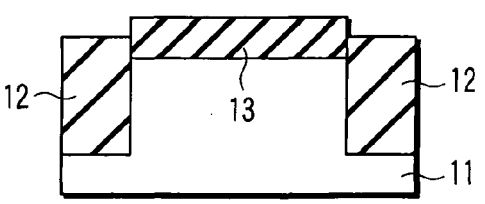
F I G. 16D
F I G. 16E
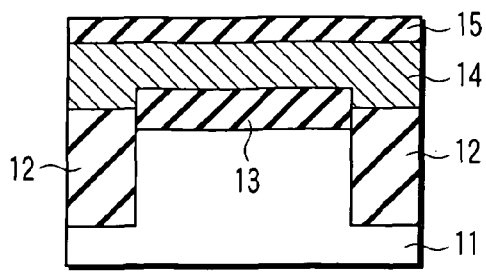
F I G. 16F
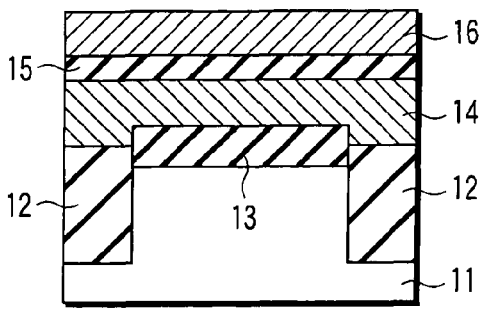
F I G. 16G
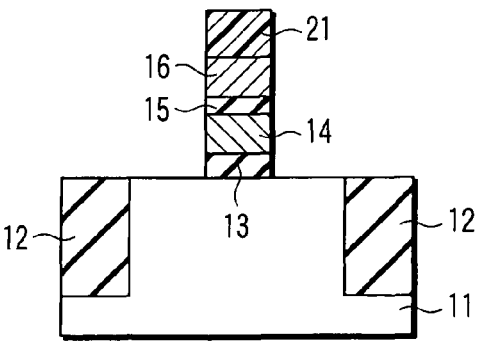
F I G. 16H
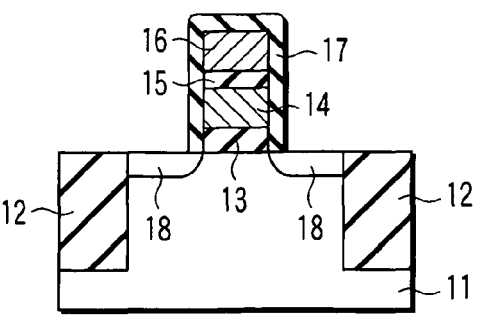
F I G. 16I

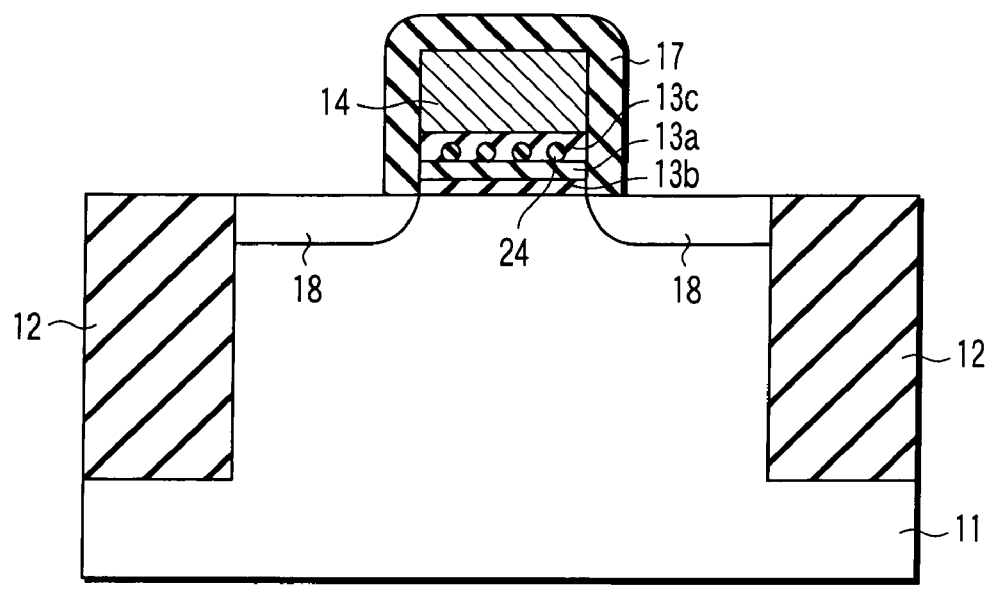
F I G. 20
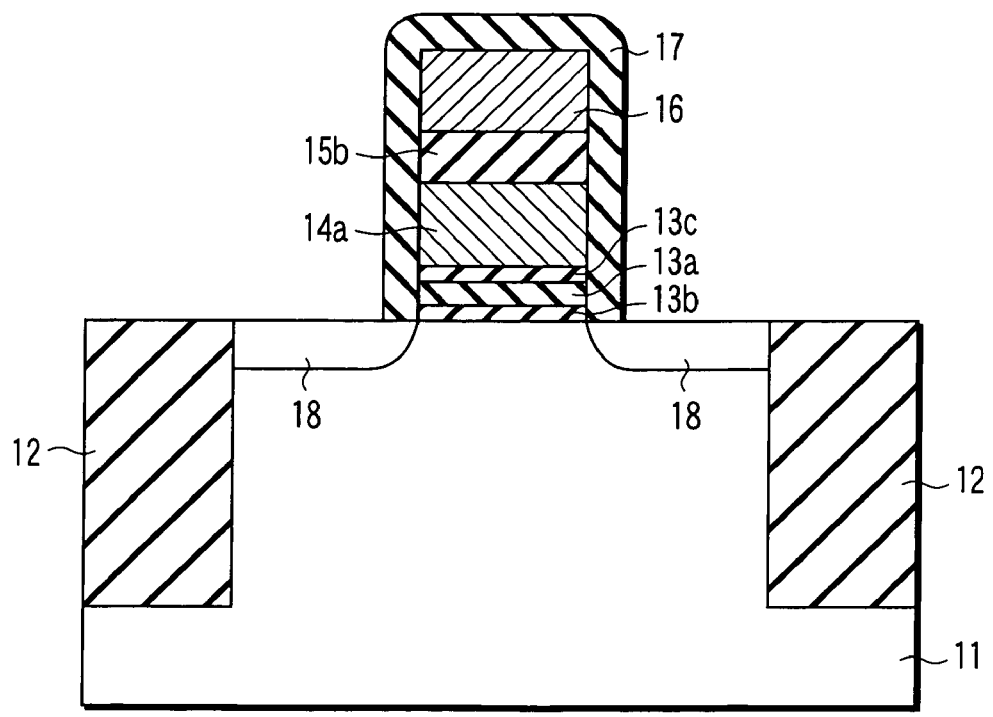
F I G. 21

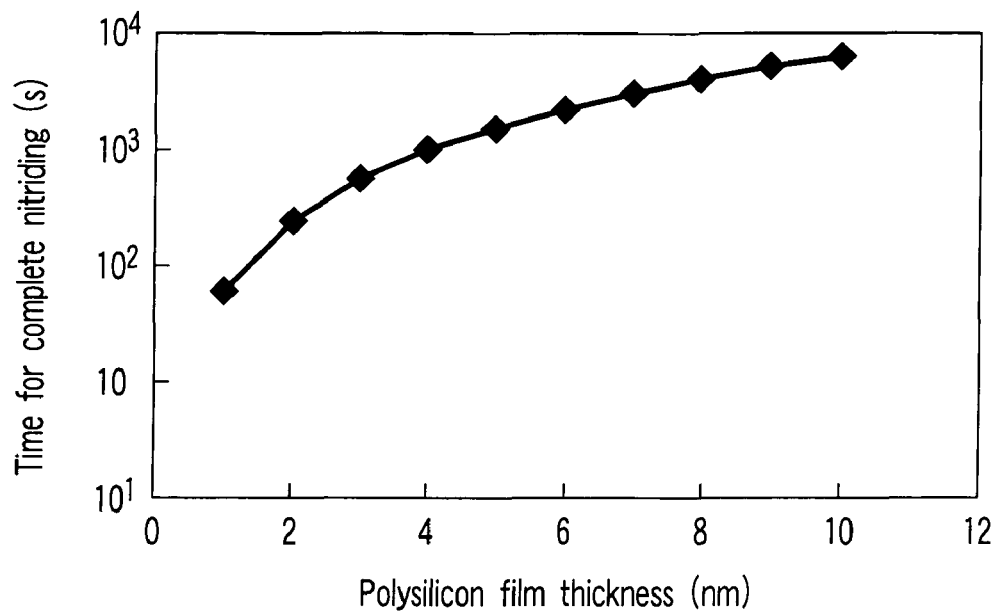
F I G. 31
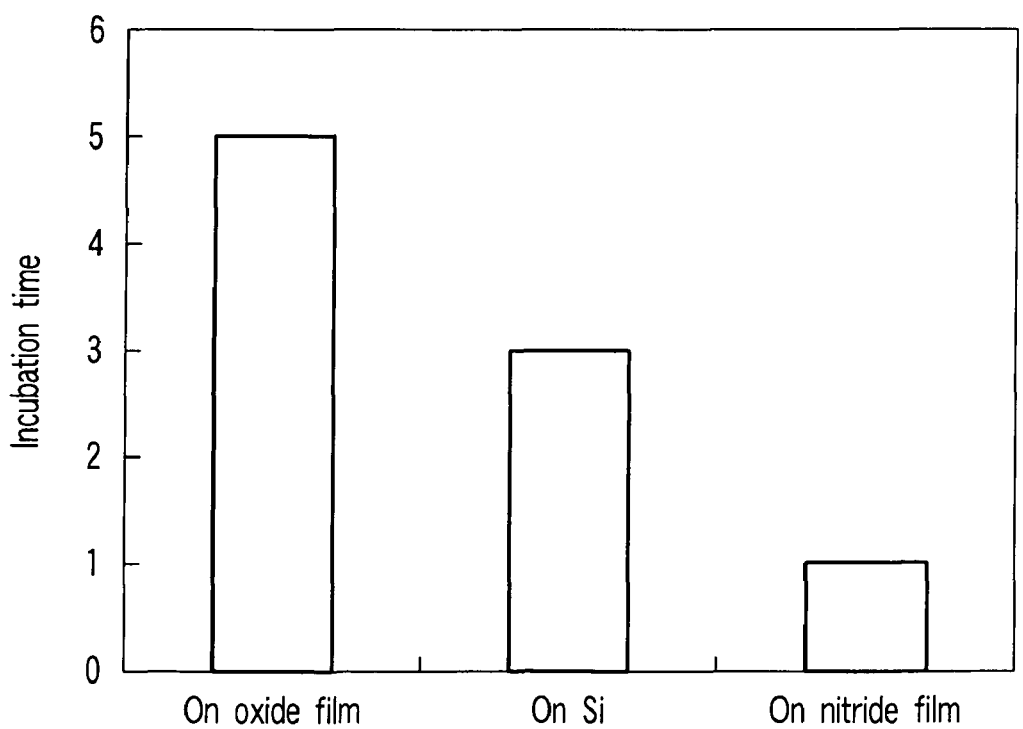
F I G. 32

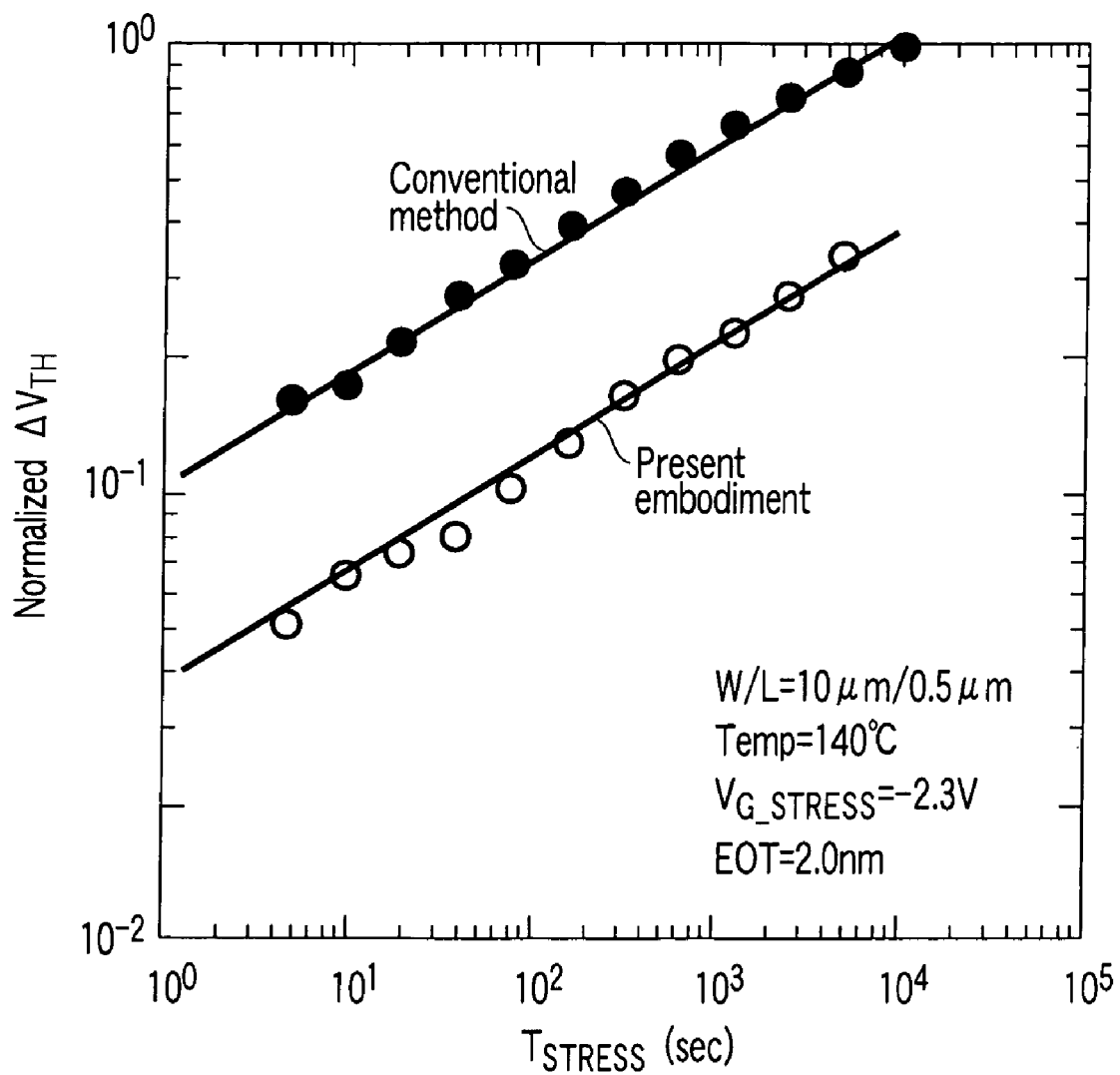
F I G. 38

NONVOLATILE SEMICONDUCTOR MEMORY DEVICE, SEMICONDUCTOR DEVICE AND MANUFACTURING METHOD OF NONVOLATILE SEMICONDUCTOR MEMORY DEVICE

CROSS-REFERENCE TO RELATED APPLICATIONS

This application is based upon and claims the benefit of priority from prior Japanese Patent Applications No. 2005-214613, filed Jul. 25, 2005; and No. 2006-123914, filed Apr. 27, 2006, the entire contents of both of which are incorporated herein by reference.

BACKGROUND OF THE INVENTION

1. Field of the Invention

This invention relates to a nonvolatile semiconductor memory device with a stacked gate structure having a floating gate electrode and control gate electrode stacked on a semiconductor substrate and a manufacturing method thereof. Further, this invention relates to a semiconductor device having a gate electrode formed on a semiconductor substrate with a gate insulating film disposed therebetween.

2. Description of the Related Art

Recently, miniaturization of elements is rapidly advanced in an electrically programmable and erasable nonvolatile semiconductor memory (EEPROM). In the EEPROM, high voltage is applied to the control gate electrode in the case of programming. Then, electrons are injected from the substrate side into the floating gate electrode which lies under an inter-poly insulating film via a tunnel insulating film. In the case of erasing, electrons in the floating gate are extracted.

For injection or extraction of electrons with respect to the floating gate, high voltage is required and great stress is applied to the tunnel insulating film formed of an oxide film. As a result, defects called traps are formed in the tunnel insulating film. Therefore, a leak current increases and the data holding characteristic will be deteriorated. The leak current caused by application of the stress depends on the film thickness of the tunnel insulating film to a great extent and the leak current more easily flow as the film thickness becomes smaller. The phenomenon becomes a main factor which prevents the tunnel insulating film from being made thin.

As the measure for solving the above problem, a method for reducing the leak current by introducing nitrogen into the tunnel insulating film to increase the dielectric constant of the tunnel insulating film and increase the physical film thickness is used. In this case, nitrogen is introduced into the tunnel insulating film by annealing a silicon oxide film in ammonium ($NH_3$) gas, nitrogen monoxide (NO) gas or dinitrogen monoxide ($N_2O$) gas. However, in the process using $NH_3$ gas, for example, an after-heat treatment at high temperatures is required to securely maintain the high reliability since a large amount of hydrogen is introduced in the tunnel insulating film. Further, in a process using NO or $N_2O$ gas, there occurs a problem which is associated with the reliability and in which a hole trap amount at the stress application time increases (JP-A H1-307272 (KOKAI)).

Further, recently, using an insulating film with a dielectric constant larger than that of a conventional silicon oxide film or silicon oxide-nitride film as an inter-poly insulating film is studied with miniaturization of the nonvolatile semiconductor memory device. However, when an insulating film with the large dielectric constant such as a metal oxide film is sued as the inter-poly insulating film, metal is diffused through the floating gate electrode and further diffused into the tunnel insulating film, thereby causing the reliability of the tunnel insulating film to be deteriorated.

BRIEF SUMMARY OF THE INVENTION

An object of this invention is to form a tunnel insulating film of a nonvolatile semiconductor memory device into an insulating film with high quality in which defects are difficult to occur and reduce a leak current.

According to one aspect of this invention, there is provided a nonvolatile semiconductor memory device comprising a first gate insulating film selectively formed on a main surface of a semiconductor substrate of a first conductivity type, the first gate insulating film including a three-layered structure in which a first insulating film containing at least silicon and nitrogen is sandwiched between a second insulating film containing at least silicon and oxygen and a third insulating film containing at least silicon and oxygen, the first insulating film being formed of a film which is continuous in an in-plane direction and having 3-coordinate nitrogen bonds and at least one of second neighboring atoms of nitrogen being nitrogen; a floating gate electrode formed on the first gate insulating film; a second gate insulating film formed on the floating gate electrode; a control gate electrode formed on the second gate insulating film; and source and drain regions of a second conductivity type formed on the main surface of the substrate.

According to another aspect of this invention, there is provided a semiconductor device comprising a gate insulating film selectively formed on a main surface of a semiconductor substrate of a first conductivity type, the gate insulating film including a three-layered structure in which a silicon nitride film is sandwiched between silicon oxide films, the silicon nitride film being a film which is continuous in an in-plane direction and having 3-coordinate nitrogen bonds and at least one of second neighboring atoms of nitrogen being nitrogen; a gate electrode formed on the gate insulating film; and source and drain regions of a second conductivity type formed on the main surface of the substrate.

According to still another aspect of this invention, there is provided a nonvolatile semiconductor memory device comprising an element region of a first conductivity type formed in a wall shape on a substrate; a first gate insulating film formed to cover part of the element region, the first gate insulating film including a three-layered structure in which a silicon nitride film is sandwiched between silicon oxide films, the silicon nitride film being formed of a film which is continuous in an in-plane direction and having 3-coordinate nitrogen bonds and at least one of second neighboring atoms of nitrogen being nitrogen; a floating gate electrode formed on the first gate insulating film; a second gate insulating film formed on the floating gate electrode; a control gate electrode formed on the second gate insulating film; and source and drain regions of a second conductivity type formed in the element region between which a gate portion is arranged, the gate portion being formed of the floating gate electrode, control gate electrode and first and second gate insulating films.

According to another aspect of this invention, there is provided a manufacturing method of a nonvolatile semiconductor memory device, comprising forming a first gate insulating film by oxidizing a main surface of a semiconductor substrate of a first conductivity type to form a first silicon oxide film, depositing an amorphous silicon film on the first silicon oxide film, nitriding the amorphous silicon film to form a silicon nitride film and forming a second silicon oxide film on the silicon nitride film; forming a floating gate electrode on the first gate insulating film; forming a second gate insulating film on the floating gate electrode; forming a control gate electrode on the second gate insulating film; forming a gate portion by etching a laminated film of the floating gate electrode, the control gate electrode and the first gate insulating film and the second gate insulating film into a gate pattern; and forming source and drain regions of a second conductivity type in the substrate with the gate portion used as a mask.

According to another aspect of this invention, there is provided a manufacturing method of a nonvolatile semiconductor memory device, comprising forming a first gate insulating film by oxidizing a main surface of a semiconductor substrate of a first conductivity type to form a first silicon oxide film, depositing a crystalline silicon film on the first silicon oxide film, nitriding the crystalline silicon film to form a silicon nitride film and forming a second silicon oxide film on the silicon nitride film; forming a floating gate electrode on the first gate insulating film; forming a second gate insulating film on the floating gate electrode; forming a control gate electrode on the second gate insulating film; forming a gate portion by etching a laminated film of the floating gate electrode, the control gate electrode, the first gate insulating film and the second gate insulating film into a gate pattern, and forming source and drain regions of a second conductivity type in the substrate with the gate portion used as a mask.

BRIEF DESCRIPTION OF THE SEVERAL VIEWS OF THE DRAWING

FIG. 1 is a cross sectional view showing the schematic structure of a nonvolatile semiconductor memory device according to a first embodiment of this invention.

FIG. 2 is a cross sectional view showing the concrete structure of a tunnel insulating film used in the first embodiment.

FIGS. 4A to 4C are views showing the conventional manufacturing process of a tunnel insulating film and the bond state of nitrogen.

FIGS. 16A to 16I are cross sectional views showing the manufacturing process of a nonvolatile semiconductor memory device according to a third embodiment of this invention.

FIG. 20 is a cross sectional view showing the element structure of one example of the nonvolatile semiconductor memory device formed in the fifth embodiment.

FIG. 21 is a cross sectional view showing the schematic structure of a nonvolatile semiconductor memory device according to a sixth embodiment of this invention.

FIG. 31 is a diagram showing the relation between deposition time of polysilicon and time required for completely nitriding the same.

FIG. 32 is a diagram showing a difference in incubation time of polysilicon according to a difference in the background.

FIG. 38 is a diagram showing the characteristic of a CMOS inverter according to the eleventh embodiment in comparison with that of the conventional CMOS inverter.

DETAILED DESCRIPTION OF THE INVENTION

Figure 3:
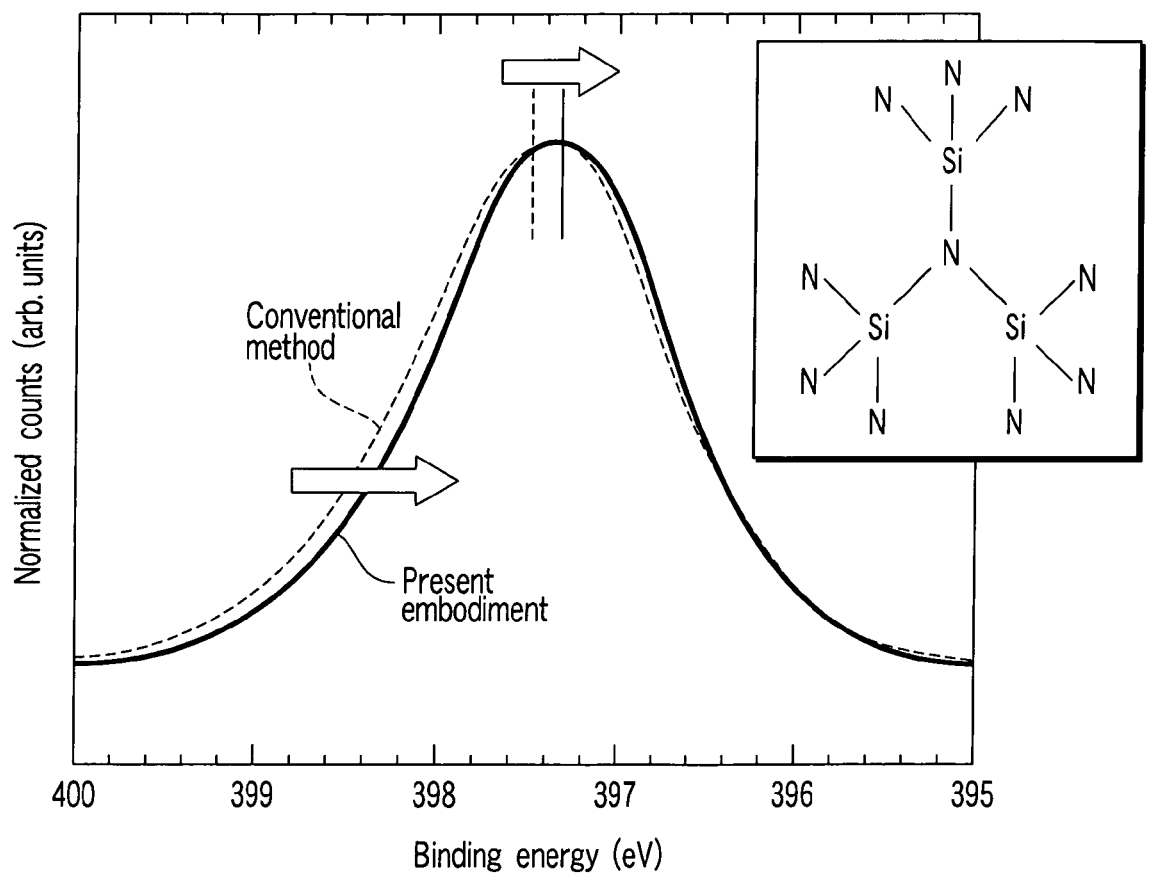
FIG. 3 is a diagram showing the spectrum of nitrogen measured by a photoelectron spectroscopy for the conventional structure and the present embodiment in which the bond state of nitrogen is a 3-coordinate bond.

There will now be described embodiments of this invention in detail with reference to the accompanying drawings.

First Embodiment

FIG. 1 is a cross sectional view showing the schematic structure of a nonvolatile semiconductor memory device according to a first embodiment of this invention.

A silicon thermal oxide film (element isolation insulating film) 12 for element isolation is embedded in and formed on a p-type (first conductivity type) silicon substrate (semiconductor substrate) 11 to surround the element forming area of the main surface of the substrate 11. On the main surface of the silicon substrate 11, a floating gate electrode 14 is formed with a tunnel insulating film (first gate insulating film) 13 disposed therebetween. On the floating gate electrode 14, a control gate electrode 16 is formed with an inter-poly insulating film (second gate insulating film) 15 disposed therebetween.

The inter-poly insulating film 15 is an ONO film with a thickness of 7 nm formed of a silicon oxide film, CVD silicon nitride film and CVD silicon oxide film, for example. The floating gate electrode 14 and control gate electrode 16 are formed of a polysilicon film.

On the side walls of the gate electrode portion formed of the tunnel insulating film 13, floating gate electrode 14, inter-poly insulating film 15 and control gate electrode 16, a silicon oxide film 17 is formed. On the main surface of the substrate 11, n-type (second conductivity type) source and drain diffusion layers 18 are formed by ion-implanting phosphorous.

The basic configuration explained so far is the same as that of the conventional device, but in the present embodiment, the configuration of the tunnel insulating film 13 is different from that of the conventional device. That is, as shown in FIG. 2, the tunnel insulating film 13 of the present embodiment is formed to have a laminated structure in which a silicon nitride film (first insulating film) 13c is sandwiched between a silicon oxide film (second insulating film) 13b and a silicon oxide film (third insulating film) 13c. In this case, the silicon nitride film 13a can be obtained by depositing an amorphous silicon film on the silicon oxide film 13b which is formed on the substrate 11 and nitriding the amorphous silicon film.

By nitriding the amorphous silicon film deposited on the silicon oxide film 13b, as shown in FIG. 3, the bond state of nitrogen can be set into a 3-coordinate bond state (that is, a state in which three bonds of nitrogen are connected to respective silicon atoms). Further, in FIG. 3, the spectrum of nitrogen measured by the photoelectron spectroscopy is shown. It is observed that the peak position is shifted towards the low bound energy side and a high-energy component is reduced in the present embodiment in comparison with the conventional method. This shows that the nitrogen bond state is more completely set into the 3-coordinate bond state. In the example of FIG. 3, the most desirable state in which all of the second neighboring atoms of nitrogen are nitrogen is set, but it is sufficient if at least one of the second neighboring atoms of nitrogen is nitrogen.

The conventional silicon nitride film is formed as follows. That is, after a silicon oxide film 13b is formed by oxidizing the silicon substrate 11 as shown in FIG. 4A, nitrogen atoms are introduced into the film 13b by exposing the same to ammonium ($NH_3$) gas atmosphere as shown in FIG. 4B, for example. As a result, a silicon nitride film 13a is formed as shown in FIG. 4C.

Nitrogen thus introduced into the film must break the bonds between silicon and oxygen whose bonding strength is high in the silicon oxide film 13b and oxygen whose bond is broken at this time cannot be outwardly diffused. Therefore, the complete 3-coordinate nitrogen bond cannot be formed. Then, an incomplete nitrogen bond state such as a 2-coordinate nitrogen bond is formed.

For example, the 2-coordinate nitrogen bond is attained by double-bonding one bond of nitrogen with silicon and a non-bonding bond is not apparently provided. However, the bond is unstable and easily tends to trap a hole. This is caused by forming a level near the valence band of silicon (silicon substrate) with which the silicon nitride film makes contact. In this case, the silicon nitride film captures holes coming from the silicon substrate side by voltage application and breaks one bond of nitrogen which is double-bonded with silicon. As a result, positive fixed charges tend to occur on the silicon side and non-bonded bonds and defects tend to occur on the nitrogen side.

On the other hand, in the tunnel insulating film 13 according to the present embodiment, nitrogen tends to have 3-coordinate nitrogen bonds since the silicon nitride film 13a is directly formed. Further, according to the present embodiment, the density of 3-coordinate nitrogen bonds can be enhanced, nitrogen bonds are stable, and therefore, nitrogen bond will not be easily broken by application of electrical stress.

Figure 5:
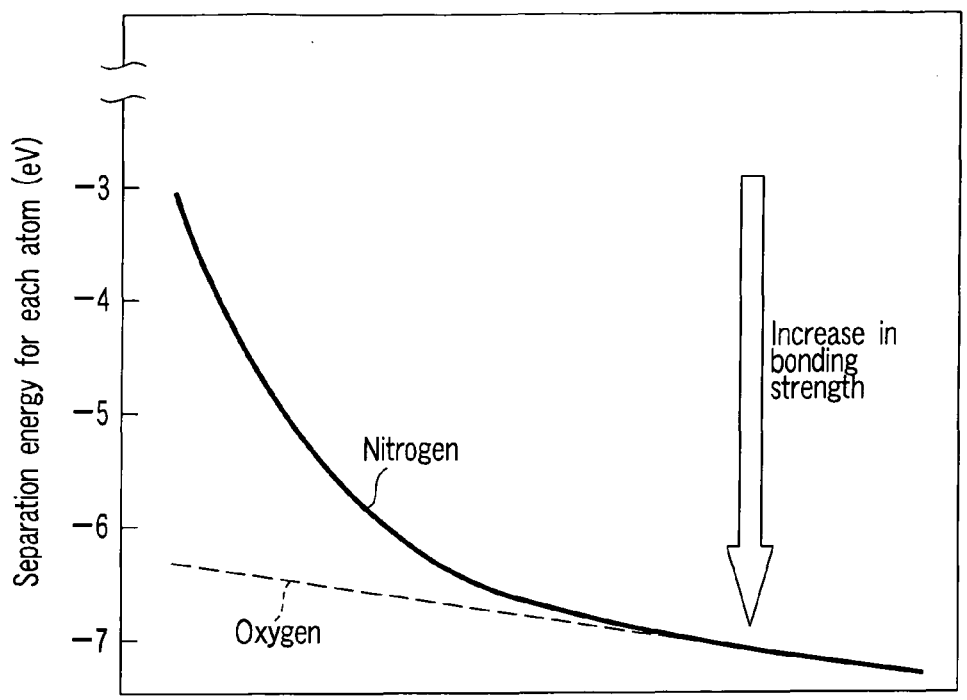
FIG. 5 is a characteristic diagram showing the relation between the density of nitrogen and bonding strength between silicon and nitrogen, for illustrating the first embodiment.

FIG. 5 is a diagram showing enhancement of the bonding energy by enhancing the concentration of nitrogen based on the first principle calculation. As is clearly understood from FIG. 5, elimination energy for each atom becomes lower as the density of nitrogen atoms in silicon becomes higher. That is, strong bonds corresponding to silicon-oxygen bonds of the silicon oxide film can be attained by aggregating nitrogen atoms at high concentration.

Figure 6:
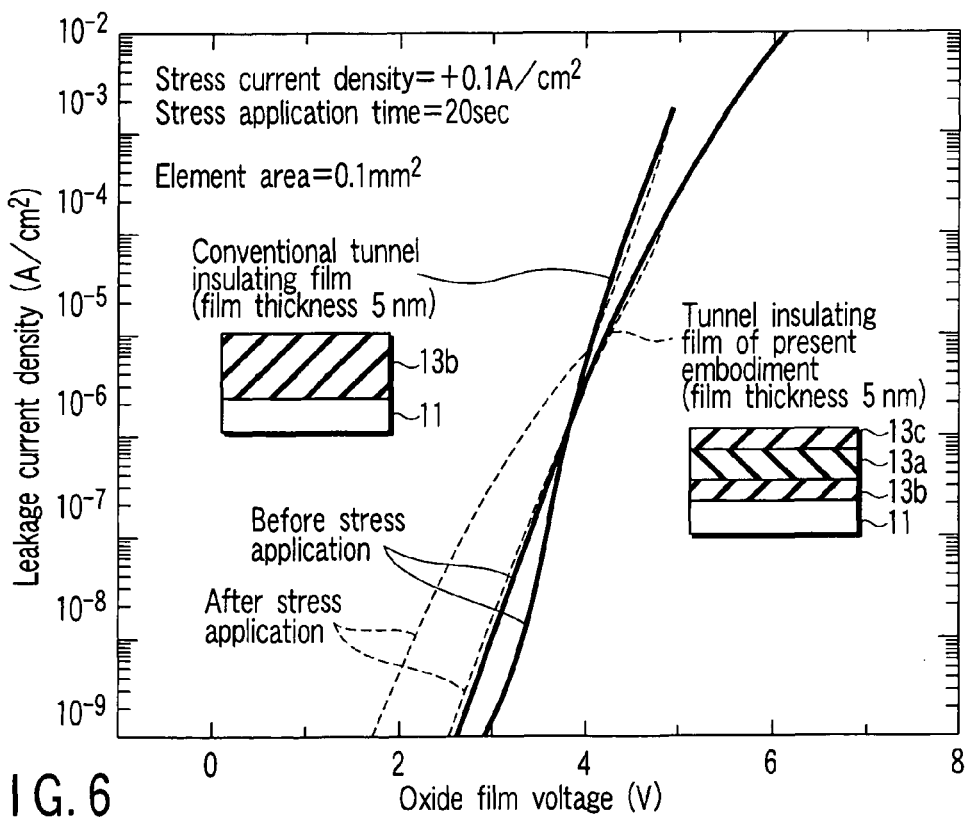
FIG. 6 is a characteristic diagram showing the relation between oxide film voltage and leak current density for tunnel insulating films in the conventional case and in the first embodiment.

The electrical characteristic of a MOS capacitor formed by the above method is shown in FIG. 6. FIG. 6 is a characteristic diagram showing the tunnel insulating film of the present embodiment in comparison with that of the conventional case. Leak currents (Stress Induced Leakage Currents: SILC) which are increased by applying electrical stresses to the respective tunneling insulating films are compared with each other. The stress induced leakage current is a leak current flowing through the defects formed in the insulating film by application of electrical stress and the leak current increases as a large amount of defects are formed in the film.

According to FIG. 6, it is understood that the stress induced leakage current is markedly increased by application of stress in the tunnel insulating film of the conventional case, but it is not substantially increased in the present embodiment. That is, it is understood that formation of defects in the film is suppressed in the present embodiment and the tunnel insulating film in the present embodiment has high quality and is highly reliable. Further, in the present embodiment, the silicon nitride film 13a with 3-coordinate bonds which are stable in structure is formed in the central portion of the tunnel insulating film 13 and sandwiched between the silicon oxide films 13b and 13c. Therefore, formation of defects near the central portion of the film which most contributes to generation of the stress induced leakage current can be suppressed.

Figure 7A:
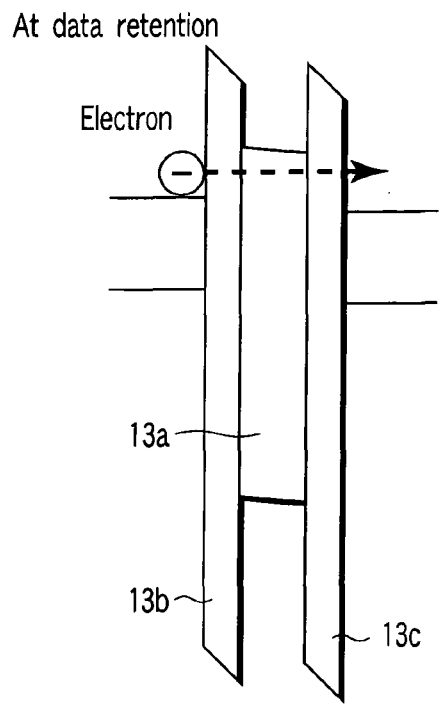
FIGS. 7A and 7B are views showing MOS band structures, for illustrating the effect of the first embodiment.
Figure 7B:
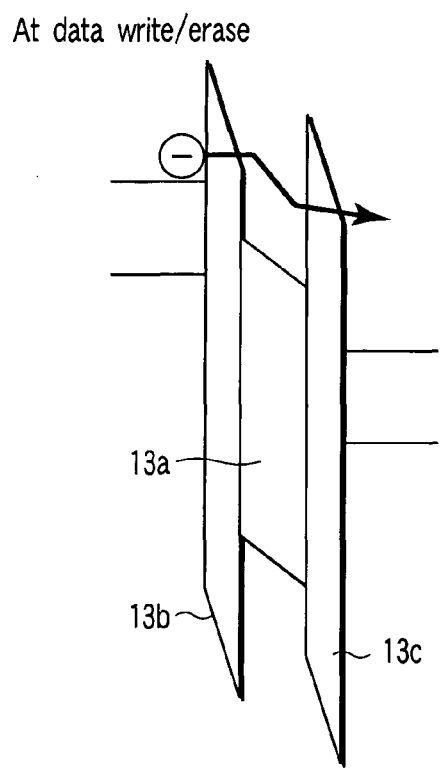

Further, as shown in FIGS. 7A and 7B, the effect for the operation of lowering the write voltage is also attained. FIGS. 7A and 7B are schematic views showing the band structures of a MOS capacitor obtained in this embodiment. The tunnel insulating film 13 in this embodiment has a structure in which the silicon nitride film 13a is sandwiched between the silicon oxide films 13b and 13c. At the data holding time, that is, in a state in which a weak electric field is applied to the tunnel insulating film 13, as shown in FIG. 7A, the tunneling probability of electrons is small and no current flows due to the total film thickness of barrier heights of the silicon oxide films 13b, 13c.

On the other hand, when voltage is applied to the above structure, as shown in FIG. 7B, a stronger electric field is applied to the silicon oxide films 13b, 13c with small dielectric constants. Then, electrons tunnel through the thin silicon oxide films 13b, 13c and get over the small barrier height of the silicon nitride film 13a so as to easily pass toward the anode side. As a result, both of the excellent data holding characteristic and the operation of lowering the write voltage can be attained. Further, although not shown here, the structure is effective in suppressing deterioration of the reliability and interface characteristic due to introduction of nitrogen which is well known in the art since the silicon oxide film 13b is formed on the interface on the silicon substrate side.

Figure 8A:
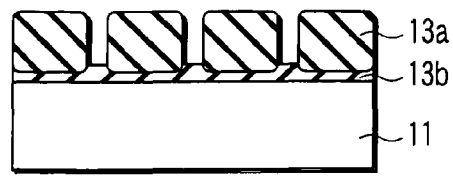
FIGS. 8A to 8D are cross sectional views of the steps showing the necessity of continuity of the tunnel insulating film, for illustrating the effect of the first embodiment.
Figure 8B:
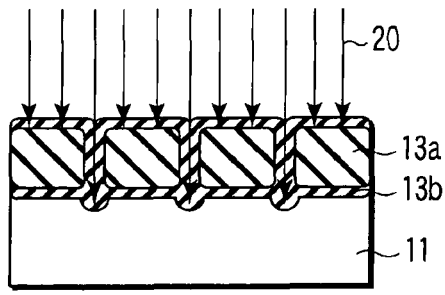

FIGS. 8A to 8D are views for illustrating the effect of this embodiment. If the nitriding process of a silicon layer is performed at high temperatures of, for example, 800° C. or more under a pressure of 100 Torr (13300 Pa) or more, silicon nitride films 13a cannot be formed as a continuous film in the in-plane direction as shown in FIG. 8A. For example, if an oxidation process is performed by using an oxidizing agent 20 such as oxygen for the above film, oxygen penetrates into gaps between the silicon nitride films 13a as shown in FIG. 8B to oxidize corresponding portions. As a result, a silicon oxide film 13b which is non-uniform in the in-plane direction is formed on the interface.

Figure 8C:
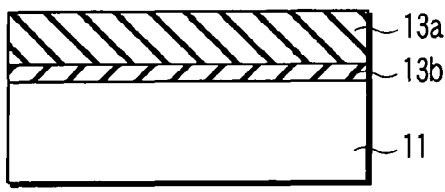
Figure 8D:
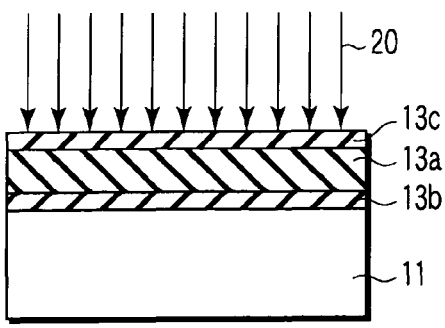

If the nitriding process is performed at temperatures of lower than 800° C. as in the present embodiment, for example, a silicon nitride film 13a which is continuous in the in-plane direction is formed as shown in FIG. 8C even under high pressure exceeding 100 Torr. If the above film is oxidized by use of an oxidizing agent 20 such as oxygen, a silicon oxide film 13c or an oxynitride film (silicon oxide-nitride film) containing nitrogen is uniformly formed only on the surface of the silicon nitride film 13a as shown in FIG. 8D. The silicon nitride film which can be realized in the present embodiment can be formed as a film which contains 3-coordinate nitrogen bonds with high density as shown in FIG. 3. Therefore, as shown in FIG. 5, the bonding strength of the nitrogen-silicon bond can be set as high as the bonding strength of the oxygen-silicon bond.

Figure 9:
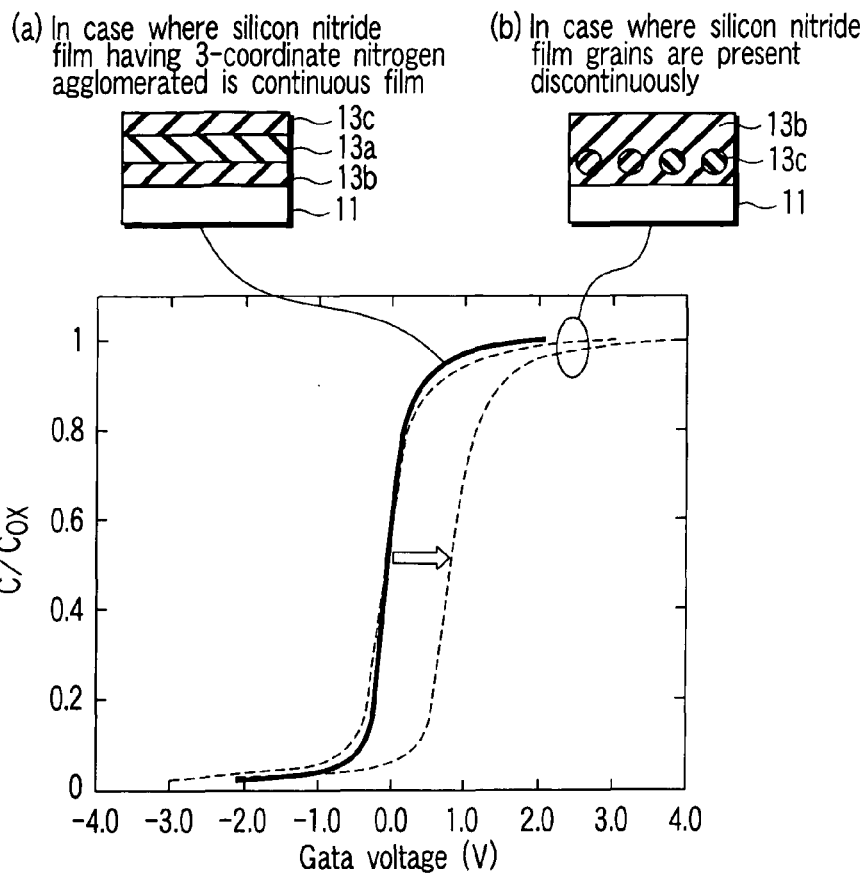
FIG. 9 is a characteristic diagram showing the relation between the voltage of the tunnel insulating film and capacity, for illustrating the effect of the first embodiment.

FIG. 9 is a characteristic diagram of the MOS structure including a gate insulating film having a silicon nitride film sandwiched between silicon oxide films and shows cases where the silicon nitride film is formed as a continuous film and a non-continuous film. As known examples of the structures having the continuous and non-continuous silicon nitride films each sandwiched between the silicon oxide films, a MONOS memory or dot memory is provided. In the above cases, the silicon nitride film itself is used as a location of trapping charges to attain the memory characteristic. As an example, the present embodiment is compared with the dots of the silicon nitride film (granular silicon nitride film).

Since the MONOS memory or dot memory utilizes generation of traps in the silicon nitride film, the silicon nitride film used has 2-coordinate nitrogen bonds. Therefore, by applying a strong electric field, charges are trapped in the silicon nitride film and the voltage-capacitance characteristic is shifted according to the polarity and an amount of trapped charges. An example indicated by broken lines in FIG. 9 indicates a case where electrons are trapped in the dots of the silicon nitride film. In the present embodiment, since a silicon nitride film having 3-coordinate nitrogen bonds in which generation of traps is suppressed is used, defects in which electrons or positive holes can be captured are difficult to be formed. Therefore, shifting of the voltage-capacitance characteristic is not observed even after application of strong electric field stress.

Figure 10:
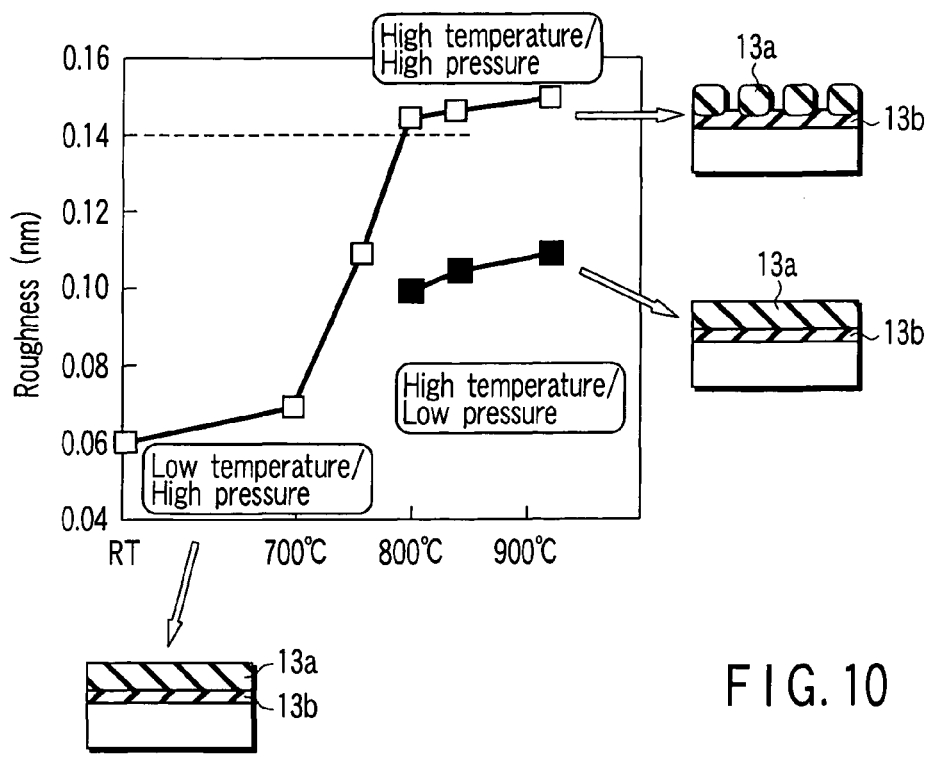
FIG. 10 is a characteristic diagram showing the degree of roughness of a silicon nitride film, for illustrating the effect of the first embodiment.

FIG. 10 is a characteristic diagram showing the film-formation temperature, film-formation pressure and influences thereof exerted on the film quality when a silicon nitride film is formed. If the nitriding process is performed at high temperatures of 800° C. or more under pressure exceeding 100 Torr (13300 Pa), an aggregated and non-continuous silicon nitride film is formed in some cases. On the other hand, if the nitriding process is performed in a condition of temperatures of 800° C. or more and pressures of 100 Torr or less or in a condition of temperatures lower than 800° C. and high or low pressure, a flat and continuous silicon nitride film can be formed. In the tunnel insulating film forming process used in this embodiment, it is necessary to perform the process of forming the silicon nitride film at temperatures lower than 800° C. or at temperatures of 800° C. or more under pressures of 100 Torr or less.

Figure 11:
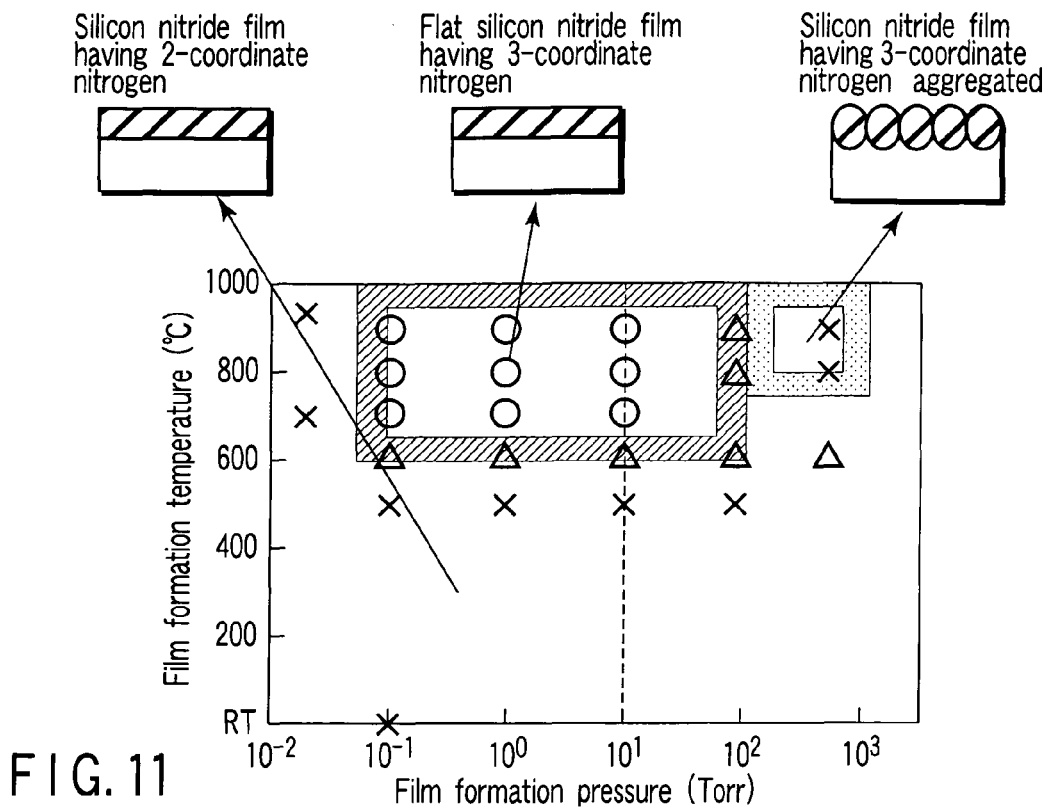
FIG. 11 is a diagram showing a desired range of nitriding temperature and film-formation pressure when a silicon nitride film is formed by nitriding an amorphous silicon film, for illustrating the effect of the first embodiment.

Further, the film-formation temperature and film-formation pressure at the time of formation of the silicon nitride film are explained. FIG. 11 is a diagram showing the result obtained in a case where the film thickness and the degree of flatness of the silicon nitride film are expressed by use of the nitriding temperature and film-formation pressure when an amorphous silicon film is nitrided.

As shown in FIG. 11, the film thickness and the degree of flatness of the silicon nitride film can be controlled according to the nitriding temperature and film-formation pressure. In this invention, a flat silicon nitride film having 3-coordinate nitrogen bonds at high density is required. Therefore, a flat silicon nitride film can be obtained at temperatures lower than 600° C. as shown in FIG. 11, but the density of 3-coordinate nitrogen bonds is low and it contains incomplete bonds such as 2-coordinate nitrogen bonds. Therefore, generation of defects in the film which act as the source of a stress leak current cannot be suppressed. If the nitriding process is performed at high temperatures of 800° C. or more under pressure higher than 100 Torr, a silicon nitride film having 3-coordinate nitrogen bonds at high density can be formed, but aggregation occurs in the course of formation of the silicon nitride film, the film becomes a granular film and the degree of flatness thereof is lowered. Therefore, it is desirable to nitride amorphous silicon in a condition that the nitriding temperature is set in a range of 600° C. to 1000° C. and the nitriding pressure is set in a range of $10^{-1}$ Torr and 100 Torr.

Thus, in the nonvolatile semiconductor memory device of the present embodiment, the electric field on the silicon oxide film side can be enhanced by sandwiching the silicon nitride film 13a having the dielectric constant which is twice larger than that of the silicon oxide film between the silicon oxide films 13b and 13c and the injection efficiency is enhanced as shown in FIG. 7. Since the silicon nitride film 13a having 3-coordinate nitrogen bonds aggregated at high density is provided, generation of defects formed, particularly, by application of stress (that is, at the write or erase time in the strong electric field) is suppressed and a stress induced leakage current is suppressed. Further, since the laminated structure of the silicon oxide films 13b, 13c and the silicon nitride film 13a is provided, defects caused by application of high voltage stress are suppressed from coupling the substrate side to the floating gate and dielectric breakdown becomes difficult to occur. As a result, the service time of the memory device becomes long and the reliability thereof is made high.

Second Embodiment

FIGS. 12A to 12E are cross sectional views showing a manufacturing process of a nonvolatile semiconductor memory device according to a second embodiment of this invention, and particularly, a manufacturing process of a tunnel insulating film. Portions which are the same as those of FIG. 1 are denoted by the same reference symbols and the detail explanation thereof is omitted.

Figure 12A:
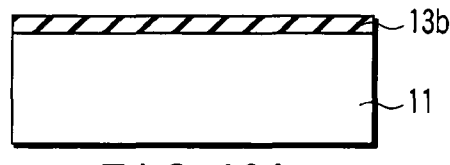
FIGS. 12A to 12E are cross sectional views showing a manufacturing process of a nonvolatile semiconductor memory device according to a second embodiment of this invention, and particularly, a manufacturing process of a tunnel insulating film.
Figure 12B:
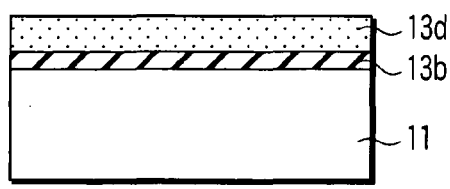

First, as shown in FIG. 12A, the surface of a silicon substrate 11 is oxidized by use of oxygen gas, for example, to form a silicon oxide film 13b with a thickness of approximately 2 nm. Then, as shown in FIG. 12B, for example, a flat amorphous silicon film 13d with a thickness of approximately 1 nm is formed on the silicon oxide film 13b by use of disilane gas.

Figure 12C:
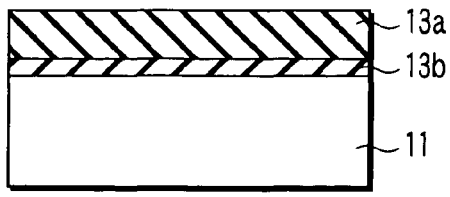

Next, as shown in FIG. 12C, the amorphous silicon film 13d is directly nitrided at a temperature of 700° C. under a pressure of 50 Torr (6650 Pa) by using a plasma nitriding method, for example. Thus, a silicon nitride film 13a with a thickness of approximately 2 nm is formed. At this time, for example, nitrogen is used as a gas source for the plasma nitriding process, but if the nitriding process is performed by use of a mixture of oxygen and nitrogen, a silicon nitride film (so-called oxynitride film) having oxygen introduced therein can be formed. Further, the concentration of oxygen in the silicon nitride film can be controlled to a desired concentration by changing the mixture ratio of the nitriding gas to oxidizing gas.

Figure 12D:
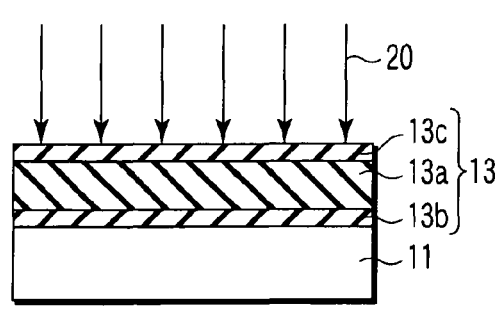
Figure 12E:
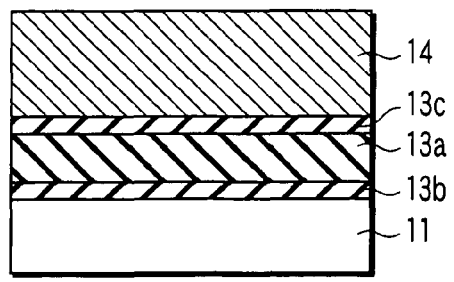

After this, the surface of the silicon nitride film 13a is oxidized by use of oxygen gas (oxidizing agent) 20, for example, to form a silicon oxide film 13c with a thickness of approximately 2 nm. Thus, as shown in FIG. 12D, a tunnel insulating film 13 formed of the silicon nitride film 13a sandwiched between the silicon oxide films 13b and 13c is formed. Then, as shown in FIG. 12E, an n-type polysilicon film with a thickness of 200 nm having phosphorus doped therein is deposited as a floating gate electrode 14 on the tunnel insulating film 13. Thus, a MOS structure can be formed.

After this, a nonvolatile semiconductor memory device can be manufactured by depositing an inter-poly insulating film and a polysilicon film as a control gate and processing the above films into gate patterns.

Figure 13:
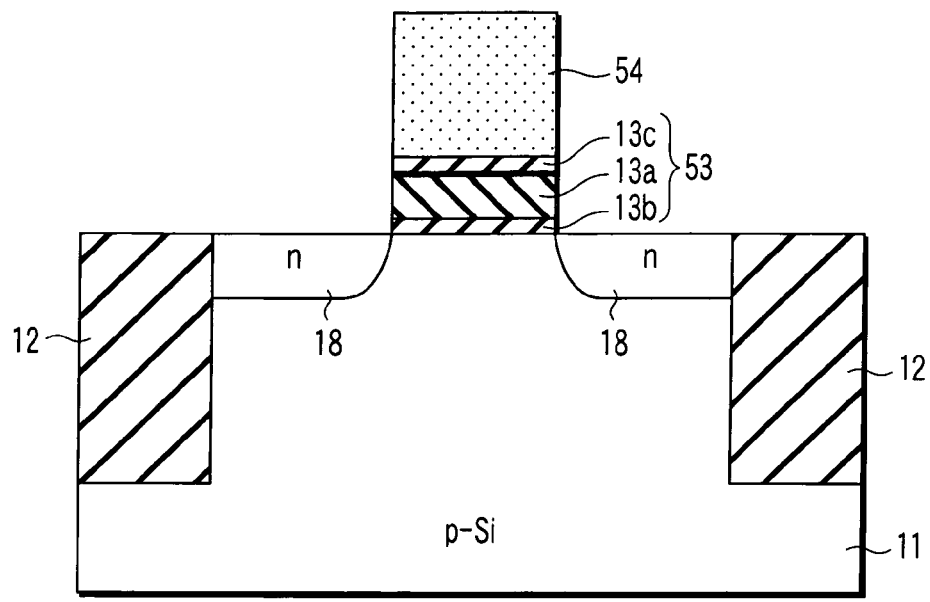
FIG. 13 is a cross sectional view showing the schematic structure of a MOS transistor, for illustrating a modification of the first embodiment.

Further, a normal MOS transistor can be formed as shown in FIG. 13 by processing the gate pattern in the state shown in FIG. 12E and forming source and drain regions without depositing an inter-poly insulating film and a polysilicon film. In FIG. 13, a reference symbols 53 denotes a gate insulating film formed by sandwiching the silicon nitride film 13a between the silicon oxide films 13b and 13c and a reference symbol 54 denotes a gate electrode formed of polysilicon or the like.

Figure 14:
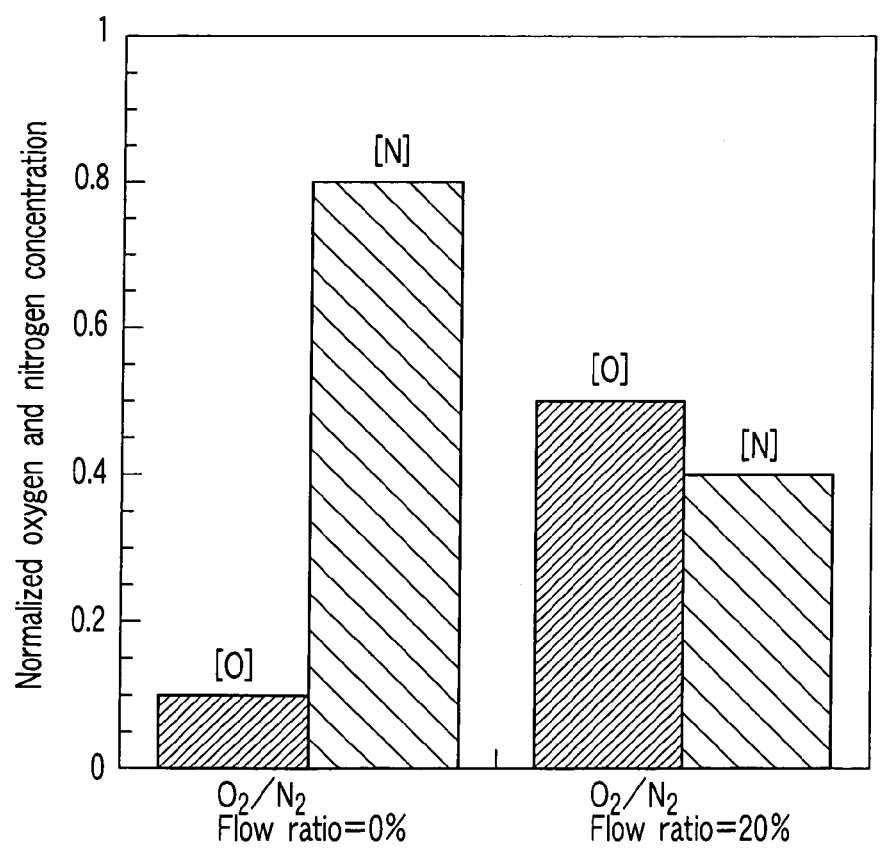
FIG. 14 is a diagram showing the result of analysis of oxygen concentration in the silicon nitride film.

FIG. 14 shows the result of analysis of oxygen concentration in the silicon nitride film. When the nitriding process is performed by use of only nitrogen gas, a small amount of oxygen is introduced by an influence of residual oxygen. Further, if oxygen gas is added by an amount corresponding to 20% of nitrogen gas, oxygen of approximately 40% in the relative concentration with respect to nitrogen can be introduced into the silicon nitride film.

As described above, if oxygen is contained in the silicon nitride film 13a, incomplete bonding portions of the silicon nitride film 13a can be replaced by oxygen and a film structure in which defects are difficult to occur can be obtained. As another advantage attained by introducing oxygen, a bandgap of the silicon nitride film can be widened by introducing oxygen and a leak current can be reduced in the operation of the nonvolatile memory.

A case wherein oxygen is used as oxidizing gas added at the time of formation of the silicon nitride film is explained above, but this invention is not limited to the above case. For example, the same effect can be attained by using oxidizing gas such as $N_2O$ or NO. Further, a method for introducing oxygen into the silicon nitride film by adding oxidizing gas at the nitriding time is explained, but this invention is not limited to this case. Specifically, for example, an oxygen-added amorphous silicon film is formed by adding oxygen gas to disilane gas at the time of formation of an amorphous silicon film. An oxygen containing silicon nitride film can be formed by use of a method for nitriding the oxygen-added amorphous silicon film in nitrogen plasma, for example.

Further, as another method, there is provided a method for forming the silicon nitride film 13a on the silicon substrate 11 by a direct nitriding process and oxidizing the above film. If an extremely thin silicon nitride film for logic is oxidized, oxygen can reach the silicon substrate (for example, Japanese Patent Publication No. 2002-83960).

Figure 15:
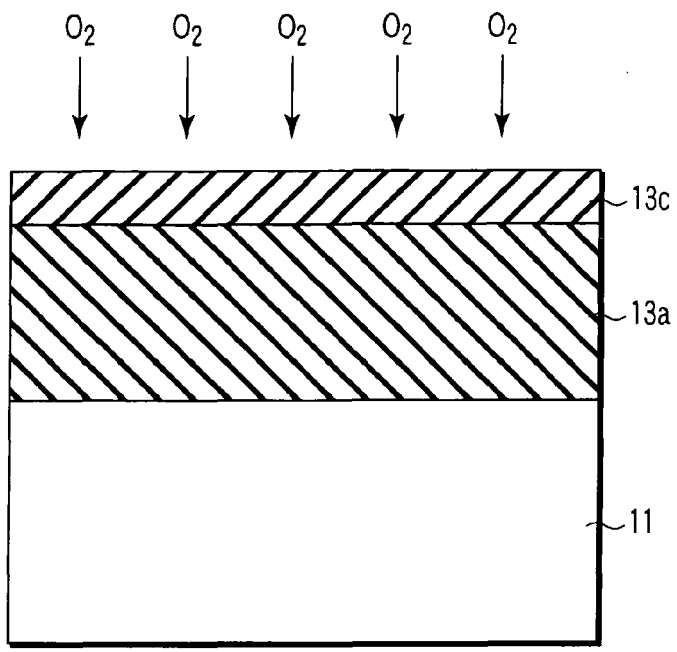
FIG. 15 is a cross sectional view showing the oxidizing state of the silicon nitride film.

However, the tunnel insulating film is thick and oxygen is difficult to pass through a silicon nitride film having 3-coordinate nitrogen bonds at high density. Therefore, as shown in FIG. 15, only the surface of the silicon nitride film 13a is oxidized and oxygen is not introduced into the interface between the silicon substrate 11 and the silicon nitride film 13a. In the case of the tunnel insulating film structure, the electron injection efficiency varies depending on the polarity of voltage applied and the write voltage and erase voltage in the flash memory will vary. Therefore, it is desirable to provide the structure in which the silicon oxide films 13b, 13c are located in both of the interfaces as in the present embodiment.

Although not shown here, if a plasma nitriding process is performed at the room temperature, for example, in the nitriding process after formation of the amorphous silicon film, an incomplete silicon nitride film having 3-coordinate nitrogen bonds at low density is formed unlike the case of the nitriding process at high temperatures. In this case, the film contains defects or structures which are easily converted into defects by application of electrical stress and does not satisfy the function as the tunnel insulating film.

However, for example, if the oxidizing process is performed by combustion oxidization by use of oxygen and hydrogen at 750° C., a substance containing oxygen or hydrogen and oxygen is diffused into the silicon nitride film and defective sites in the silicon nitride film are terminated at oxygen or hydrogen to form an oxynitride film. In the thus obtained oxynitride film, the nitrogen concentration in the film can be enhanced in comparison with a method of introducing nitrogen into the silicon oxide film which is a conventional method. Further, a weak bond in the silicon nitride film can be converted into an oxygen-silicon bond of high bonding energy and the film can be formed as a film in which a stress induced leakage current is reduced and the reliability is made high.

In the present embodiment, the amorphous silicon film is nitrided, but this is because it is desirable to form an amorphous silicon thin film in order to make the tunnel insulating film flat. Further, when nitrogen atoms or nitrogen compounds tend to diffuse in the film and bonded together to form a nitride film structure at the nitriding time, it is desirable to use a thin amorphous silicon film rather than a crystalline silicon film in order to further enhance the nitriding efficiency and realize a nitride film of high quality.

Further, the nitriding temperature is preferably set lower than the temperature at which amorphous silicon is crystallized and the nitriding temperature is preferably set lower than 700° C. This is because the degree of roughness is enhanced by crystallization although the nitriding process can be performed even after the film is crystallized. Particularly, a silicon film is aggregated and set into a granular state under vacuum of high degree before the nitriding process in some cases. Therefore, it is desirable to perform the nitriding process at temperatures lower than temperatures at which the silicon layer is crystallized in order to maintain the degree of flatness and nitriding efficiency of an amorphous film and form a tunnel insulating film with high quality and high reliability.

Third Embodiment

FIGS. 16A to 16I are cross sectional views showing the manufacturing process of a nonvolatile semiconductor memory device according to a third embodiment of this invention. Portions which are the same as those of FIG. 1 are denoted by the same reference symbols and the detail explanation thereof is omitted.

First, as shown in FIG. 16A, for example, a p-type (first conductivity type) silicon substrate 11 having plane orientation (100) and resistivity 10 to 20 Ωcm is prepared and a groove is formed in the surface of the silicon substrate 11. An element isolation insulating film 12 with a thickness of approximately 0.6 μm is formed by burying a CVD oxide film in the groove. Then, an oxidizing process is performed at 950° C. by use of oxygen gas to form a silicon oxide film 13b with a thickness of approximately 2 nm on the surface of the silicon substrate 11. Next, for example, an amorphous silicon film 13d of approximately 1.5 nm is deposited at 400° C. under 1 Torr (133 Pa) by use of a thermal CVD method using disilane gas, for example.

After this, as shown in FIG. 16B, the amorphous silicon film 13d is nitrided at the temperature of 700° C. under pressure of 50 Torr by use of a plasma nitriding method, for example. Thus, a silicon nitride film 13a with a thickness of 2 nm is formed.

Next, as shown in FIG. 16C, oxygen atoms are introduced into the silicon nitride film 13a by exposing the same to an oxygen gas atmosphere, for example, to form a silicon oxide film 13c. As a result, as shown in FIG. 16D, a tunnel insulating film (firs gate insulating film) 13 formed of the silicon nitride film 13a sandwiched between the silicon oxide films 13b and 13c is formed. In this case, as the silicon nitride film 13c, a CVD silicon oxide film deposited at 850° C. by use of dichlorosilane gas and oxygen gas, for example, can be used.

Next, as shown in FIG. 16E, an n-type polysilicon film with a thickness of 200 nm having phosphorus doped therein is deposited as a floating gate electrode 14 on the tunnel insulating film 13. Then, as shown in FIG. 16F, an ONO film with a thickness of 7 nm, for example, is formed as an inter-poly insulating film (second gate insulating film) 15 on the polysilicon film. Then, as shown in FIG. 16G, an n-type polysilicon film with a thickness of 200 nm having phosphorus doped therein is deposited as a control gate on the ONO film 15.

Next, as shown in FIG. 16H, the resultant structure is patterned by use of a resist mask 21 and then the polysilicon film used as the control gate electrode 16, the polysilicon film used as the floating gate electrode 14, tunnel insulating film 13 and ONO film 15 are etched by use of the reactive ion etching method to form a gate portion. Further, after the resist mask 21 is removed, the heat treatment is performed in the oxidation atmosphere to restore the condition damaged by the processing and then a post-oxidation film 17 with approximately 3 nm is formed.

An unwanted portion of the floating gate electrode 14 in the gate width direction is removed by an RIE process or the like before formation of the control gate electrode 16. Then, an unwanted portion of the floating gate electrode 14 in the gate lengthwise direction is removed at the same time as the gate processing time of the control gate electrode 16.

Next, for example, phosphorus is ion-implanted into the entire surface with the concentration of $3 \times 10^{15}$ cm$^{-2}$. After this, the heat treatment is performed at 1000° C. for 20 seconds, for example, to diffuse phosphorus into the silicon substrate 11 and activate the same. Thus, diffusion layers 18 used as source and drain regions are formed to configure a structure as shown in FIG. 16I.

The succeeding process is not shown in the drawing here, but for example, a silicon oxide film (inter-level insulating film) with a thickness of 300 nm is deposited on the entire surface by the CVD method and then contact holes are formed in the inter-level insulating film by an anisotropic etching process. After this, an aluminum film with a thickness of 800 nm containing silicon and copper of 0.5%, for example, is formed and then patterned to form electrodes. Next, the heat treatment is performed at 450° C. for 15 minutes in a nitrogen atmosphere containing hydrogen of 10%.

Thus, according to the present embodiment, a nonvolatile semiconductor memory having the tunnel insulating film 13 of high quality and high reliability can be formed. Further, a leak current can be suppressed by configuring the tunnel insulating film 13 with the structure having the silicon nitride film 13a sandwiched between the silicon oxide films 13b and 13c. If the thickness of the silicon nitride film 13a is set to 2 nm and the thickness of the silicon oxide films 13b, 13c is set to 2 nm, the physical film thickness of the tunnel insulating film 13 is set to 6 nm and the tunnel insulating film 13 itself can be made thin. As a result, the power supply voltage can be lowered and it becomes possible to enhance the characteristic of the device and enhance the reliability thereof.

As the method for forming the silicon nitride film having the 3-coordinate nitrogen bonds, a method in which the directly nitriding process using nitrogen plasma is taken as an example is explained, but this is not limitative. The same effect can be attained in a nitriding process using ammonium ($NH_3$) gas and nitrogen radical. Since hydrogen is introduced into the silicon nitride film if ammonium gas is used, hydrogen introduced into the film can be removed by performing the heat treatment at temperatures higher than the silicon nitride film formation temperature under vacuum or in nitrogen or inert gas after formation of the silicon nitride film.

When the heat treatment is performed at temperatures higher than the nitriding temperature under vacuum or in nitrogen or inert gas after formation of the silicon nitride film not only in a case of formation of the silicon nitride film by use of ammonium gas but also in a case of formation of a silicon nitride film by use of a different method, the condition on the structure of the silicon nitride film can be further alleviated and a 3-coordinate silicon nitride film which is more stable in structure can be realized. Further, anti-oxidation is enhanced and oxidation is limited to the surface of the silicon nitride film by subjecting the resultant structure to a high-temperature annealing process after nitriding.

Figure 17:
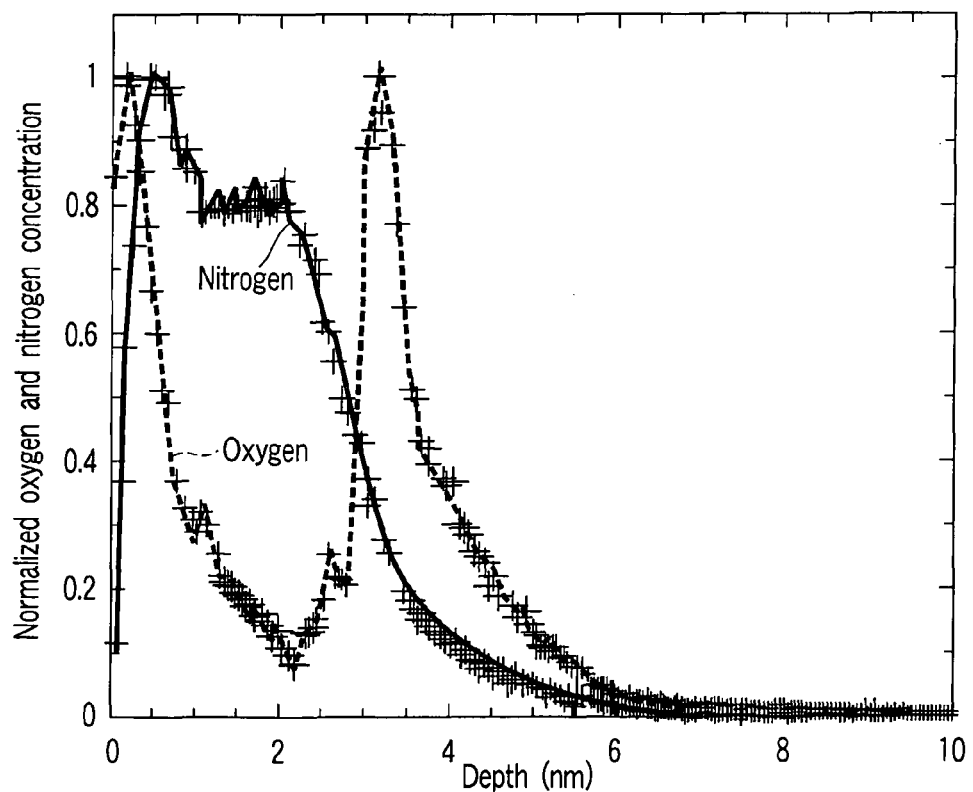
FIG. 17 is a characteristic diagram showing the concentration distributions of nitrogen and oxygen in the tunnel insulating film, for illustrating the effect of the third embodiment.

In order to explain this state, the characteristic diagram is shown in FIG. 17. FIG. 17 indicates the result of measurement of concentration distributions of oxygen and nitrogen in the tunnel insulating film by use of a secondary ion mass spectrometry. According to FIG. 17, a silicon oxide film or oxynitride film is formed on the surface of the silicon nitride film, but diffusion of oxygen into the silicon nitride film is suppressed. However, the peak of oxygen concentration observed near the interface with the silicon substrate reflects the silicon oxide film before formation of the amorphous silicon film.

In the present embodiment, a case wherein the oxidation process using oxygen ($O_2$) gas is performed in the oxidation process (FIG. 16C) after formation of the silicon nitride film is explained as an example, but this is not limitative. For example, the same effect can be obtained by performing the oxidation process using ozone ($O_3$) gas, gas containing steam ($H_2O$), oxygen radical or monoxide dinitride ($N_2O$) gas. The silicon oxide film 13c on the silicon nitride film can be converted into an oxynitride film with desired nitrogen concentration by use of a combination of the above gases.

Fourth Embodiment

FIGS. 18A to 18I are cross sectional views showing the manufacturing process of a nonvolatile semiconductor memory device according to a fourth embodiment of this invention. Portions which are the same as those of FIG. 1 are denoted by the same reference symbols and the detail explanation thereof is omitted.

As shown in FIGS. 18A to 18E, a groove is formed in the surface of a p-type silicon substrate 11 having plane orientation (100) and resistivity 10 to 20 Ωcm by use of the same process as that shown in FIGS. 16A to 16E and an element isolation insulating film 12 with a thickness of approximately 0.6 μm is buried and formed. Then, a silicon oxide film 13b of approximately 2 nm is formed on the surface of the silicon substrate and an amorphous silicon film 13d is deposited. Next, after a silicon nitride film 13a with a thickness of 2 nm is formed by using a plasma nitriding method, a silicon oxide film 13c is formed by introducing oxygen atoms 20. Thus, the tunnel insulating film 13 is formed of the silicon nitride film 13a sandwiched between the silicon oxide films 13b and 13c. After this, an n-type polysilicon film with a thickness of 200 nm having phosphorus doped therein is deposited as a floating gate electrode 14 on the tunnel oxide film 13.

Figure 18A:
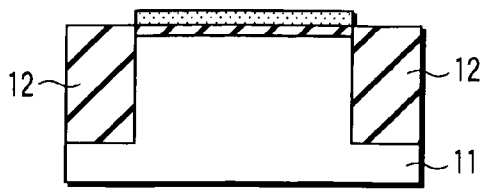
FIGS. 18A to 18I are cross sectional views showing the manufacturing process of a nonvolatile semiconductor memory device according to a fourth embodiment of this invention.
Figure 18B:
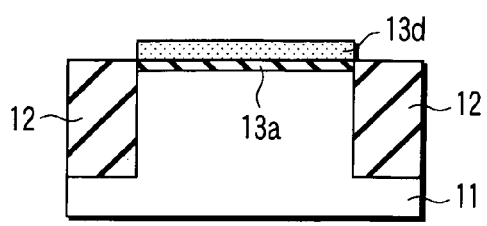
Figure 18C:
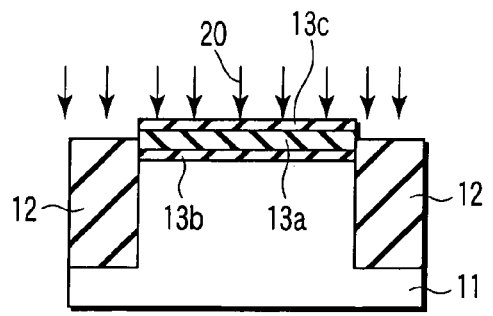
Figure 18D:
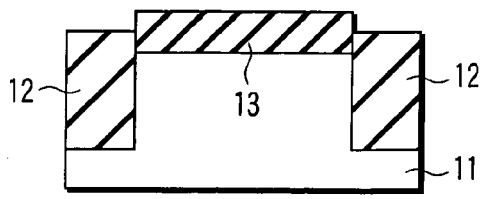
Figure 18E:
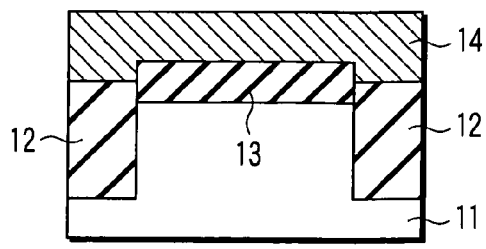
Figure 18F:
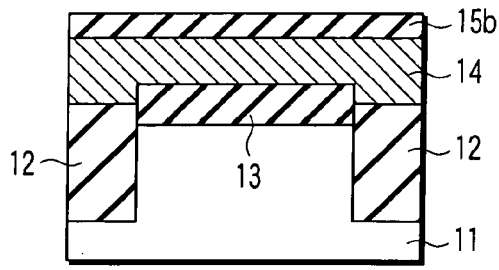
Figure 18G:
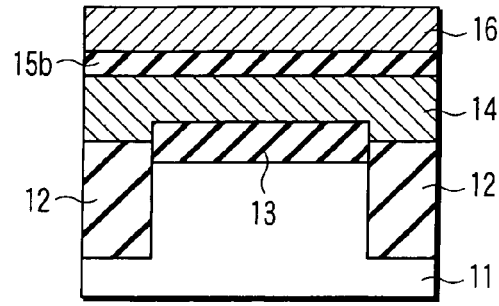

Next, as shown in FIG. 18F, a lanthanum aluminate film (LaAlOx) 15b with a thickness of 15 nm, for example, is deposited on the polysilicon film 14 by the CVD method. Then, as shown in FIG. 18G, an n-type polysilicon film with a thickness of 200 nm having phosphorus doped therein is deposited as a control gate electrode 16 on the lanthanum aluminate film 15b.

Figure 18H:
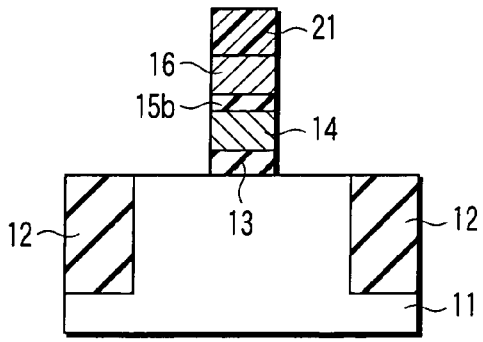

After this, as shown in FIG. 18H, the resultant structure is patterned by use of a resist mask 21 and then the polysilicon film used as the control gate electrode 16, the polysilicon film used as the floating gate electrode 14, tunnel insulating film 13 and lanthanum aluminate film 15b are etched by the reactive ion etching method to form a gate portion. Further, after the resist mask 21 is removed, the heat treatment is performed in the oxidation atmosphere to restore the condition damaged by the processing and a post-oxidation film 17 with approximately 3 nm is formed.

Figure 18I:
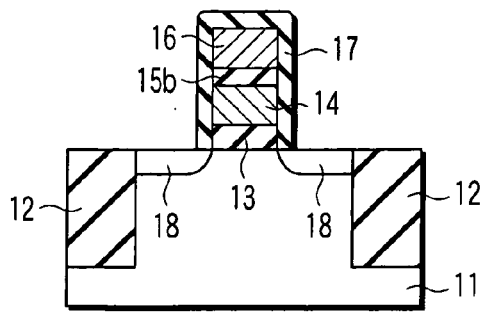

Next, for example, phosphorus is ion-implanted into the entire surface with the concentration of $3 \times 10^{15}$ $cm^{-2}$. After this, the heat treatment is performed at 1000° C. for 20 seconds, for example, to diffuse phosphorus into the silicon substrate 11 and activate the same. Thus, diffusion layers 18 used as source and drain regions are formed to configure a structure as shown in FIG. 18I.

The succeeding process is not shown in the drawing here, but like the third embodiment, for example, an inter-level insulating film is deposited by the CVD method, then contact holes are formed, electrodes formed of aluminum films are formed and then the heat treatment is performed in a nitrogen atmosphere.

Thus, according to the present embodiment, since the inter-poly insulating film between the floating gate electrode 14 and the control gate electrode 16 can be formed of the lanthanum aluminate film 15b which is a ferroelectric film, the coupling ratio between the floating gate electrode 14 and the control gate electrode 16 can be increased. Further, since the tunnel insulating film 13 can be made thin, the write voltage can be further lowered. Further, it is not necessary to enlarge the area of the insulating film 15b between the floating gate electrode 14 and the control gate electrode 16 in order to enhance the coupling ratio, the area of the insulating film 15b can be set equal to that of the tunnel insulating film 13 and the gate portion can be formed as a simple flat laminated structure. As a result, a problem of interference between cells caused by miniaturization of the device can be solved.

Further, if a High-k film such as a metal oxide film is used between the floating gate electrode 14 and the control gate electrode 16, metal impurities are diffused via a grain boundary of the polysilicon film of the floating gate electrode 14 and introduced into the tunnel insulating film 13. In the conventional tunnel insulating film, since metal impurities are easily introduced into the film, a phenomenon that traps are formed and the withstand voltage is markedly lowered occurs. On the other hand, the silicon nitride film 13a which is stable in structure can suppress diffusion of metal impurities by using the tunnel insulating film 13 of the present embodiment. Further, because of the laminated structure of the silicon oxide films 13b, 13c and silicon nitride film 13a, defects caused by metal impurities formed at the time of stress application can be suppressed from being connected from the floating gate electrode 14 to the silicon substrate interface. Therefore, deterioration in the dielectric strength can be suppressed.

In the above embodiment, a case wherein the lanthanum aluminate film (LaAlOx) is formed as the ferroelectric film 15b lying between the floating gate electrode 14 and the control gate electrode 16 is explained, but this invention is not limited to this case. For example, the same effect can be attained by using metal oxide such as aluminium oxide ($Al_2O_3$) or hafnium oxide ($HfO_2$) having a high dielectric constant, aluminate film (MAlOx, M: metal element, x: percentage of oxygen) or silicate film (MSiOx, M: metal element, x: percentage of oxygen). Further, the same effect can be attained by using oxide of transition metal such as HfO2, ZrO2, CeO2 or La2O3, LaSiOx or the like. If the ferroelectric film between the electrodes 14 and 16 is formed of a laminated structure of aluminium oxide and hafnium oxide, defects such as oxygen loss in the aluminium oxide film can be restored by use of atomic oxygen at low temperatures and thus a structure in which the leak current can be suppressed to a low level can be realized.

Fifth Embodiment

FIGS. 19A to 19E are cross sectional views showing the manufacturing process of a nonvolatile semiconductor memory device according to a fifth embodiment of this invention. Portions which are the same as those of FIG. 1 are denoted by the same reference symbols and the detail explanation thereof is omitted.

Figure 19A:
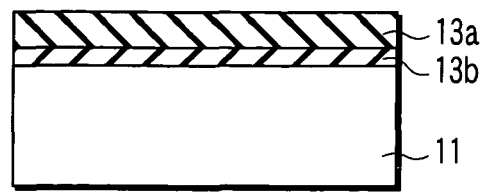
FIGS. 19A to 19E are cross sectional views showing the manufacturing process of a nonvolatile semiconductor memory device according to a fifth embodiment of this invention.

FIG. 19A shows a state in which a silicon oxide film 13b is formed on a silicon substrate 11 and a silicon nitride film 13a is formed thereon as shown in FIG. 12C. In the step shown in FIG. 12D, for example, the silicon oxide film is formed to sandwich the silicon nitride film together with the above silicon oxide film by exposing the resultant structure to oxidizing gas such as oxygen after formation of the silicon nitride film. Since the silicon nitride film has 3-coordinate bonds, the oxidation speed of the surface thereof is low.

Figure 19B:
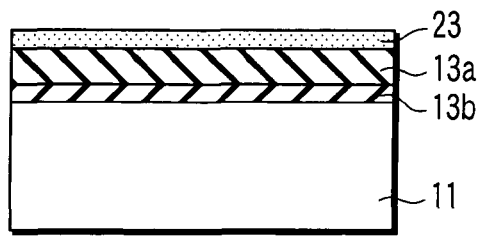
Figure 19C:
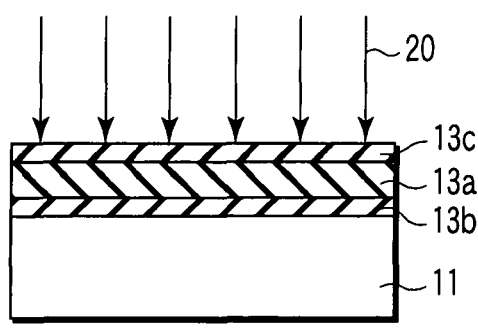
Figure 19D:
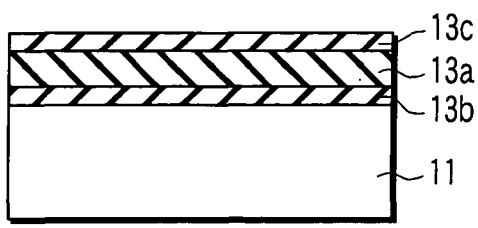

In order to solve the above problem, in the present embodiment, as shown in FIG. 19B, a silicon film 23 is deposited on the silicon nitride film 13a after formation of the silicon nitride film 13a. Then, as shown in FIG. 19C, the silicon film 23 is exposed to oxidizing gas 20 such as oxygen, for example. As a result, as shown in FIG. 19D, the silicon oxide film 23 is oxidized and converted into a silicon oxide film 13c. Further, an oxidizing agent passes through the silicon nitride film 13a to increase the film thickness of the silicon oxide film 13b in an area between the substrate 11 and the silicon nitride film 13a.

Figure 19E:
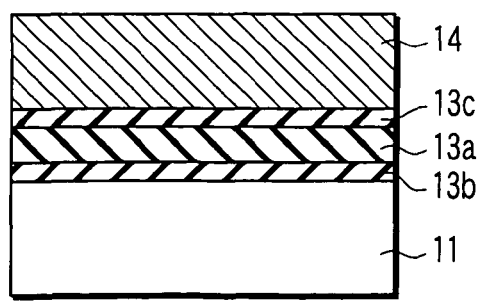

Next, as shown in FIG. 19E, a polysilicon film is deposited on the silicon oxide film 13c to form a floating gate electrode 14.

In the process of the present embodiment, the film thickness of the silicon oxide film 13c on the silicon nitride film 13a can be controlled according to the film thickness of the deposited silicon film 23. In this case, as the silicon film 23 formed on the silicon nitride film 13a, an amorphous silicon film, polysilicon film or single crystal silicon film can be used, but it is preferable to use amorphous silicon in order to uniformly deposit the silicon film on the surface of the silicon nitride film.

There occurs no problem even if a polysilicon film is used as the silicon film 23. However, since it has crystal grains having different plane orientations, silicon grains will remain on the silicon oxide film 13c in some cases when an amount of oxygen is insufficient. In this case, as shown in FIG. 20, it is possible to form a semiconductor memory device based on the quantum effect by accumulating charges on the silicon grains 24. If the silicon film is deposited by using, for example, silane ($SiH_4$) gas or dichlorosilane ($SiH_2Cl_2$) gas at a high temperature of 700° C., the deposited silicon film becomes a single crystal silicon film. Since the oxidation process uniformly proceeds if the single crystal silicon film is used, the silicon oxide film 13c with higher quality can be formed.

The "single crystal film" used here indicates a film having uniform crystallinity in the C-axis direction (vertical direction with respect to the interface) and having uniform crystallinities in the a-axis and b-axis directions (in the plane).

Sixth Embodiment

FIG. 21 is a cross sectional view showing the schematic structure of a nonvolatile semiconductor memory device according to a sixth embodiment of this invention. Portions which are the same as those of FIG. 1 are denoted by the same reference symbols and the detail explanation thereof is omitted.

In the present embodiment, a silicon thermal oxide film (element isolation insulating film) 12 for element isolation is embedded in and formed on a p-type silicon substrate 11. On the surface of the silicon substrate 11, n-type source and drain diffusion layers 18 are formed by ion-implantation of phosphorus. Further, as shown in FIG. 2, on the surface of the silicon substrate 11, a tunnel insulating film (first gate insulating film) 13 having the laminated structure of a silicon nitride film 13a sandwiched between silicon oxide films 13b, and 13c is formed.

On the tunnel insulating film 13, a nickel silicide film 14a used as a floating gate electrode is formed. Further, a lanthanum aluminate film 15b with a thickness of 15 nm is formed as a second gate insulating film on the floating gate electrode 14a. Then, a polysilicon film 16 used as a control gate electrode is formed on the second gate insulating film 15b. Further, a silicon oxide film 17 is formed on the side walls of the gate portion.

In the nonvolatile semiconductor memory with the thus configured structure, the width of the depletion layer extending in the electrode by application of voltage can be suppressed in comparison with the conventional floating gate electrode formed of a polysilicon film. Therefore, an electric field can be effectively applied to the tunnel insulating film 13 and the write voltage can be lowered.

Figure 22:
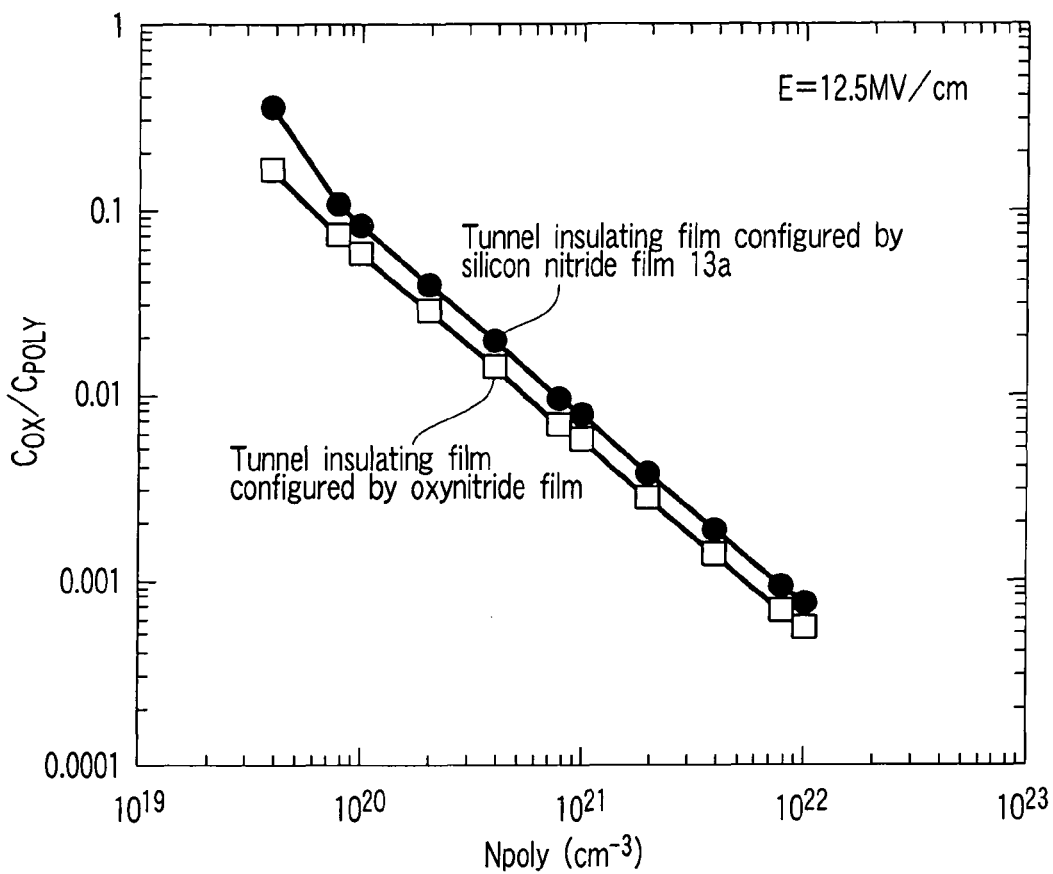
FIG. 22 is a characteristic diagram showing the width of the depletion layer in a floating gate electrode, for illustrating the effect of the sixth embodiment.

FIG. 22 is a characteristic diagram showing the above effect. When the silicon nitride film having a dielectric constant larger than that of the silicon oxide film is used, the width of the depletion layer in the polysilicon film becomes larger in comparison with a case of the conventional silicon oxide film to weaken the electric filed effectively applied to the tunnel insulating film. In order to suppress the above effect, the nickel silicide film 14a is used as a floating gate electrode.

Further, the material of the floating gate electrode is not limited to nickel silicide and other silicide such as tungsten silicide can be used. The same effect can be attained if a metal compound such as tantalum nitride (TaN) or titanium nitride (TiN) is used. Further, a metal material such as ruthenium (Ru) or tungsten (W) can be used. In these cases, since an interface layer of the silicon oxide film which will be formed by reaction with the second insulating film lying between the control gate electrode and the floating gate electrode such as a polysilicon film is difficult to be formed, it is effective to make the second insulating film thin.

Seventh Embodiment

Figure 23:
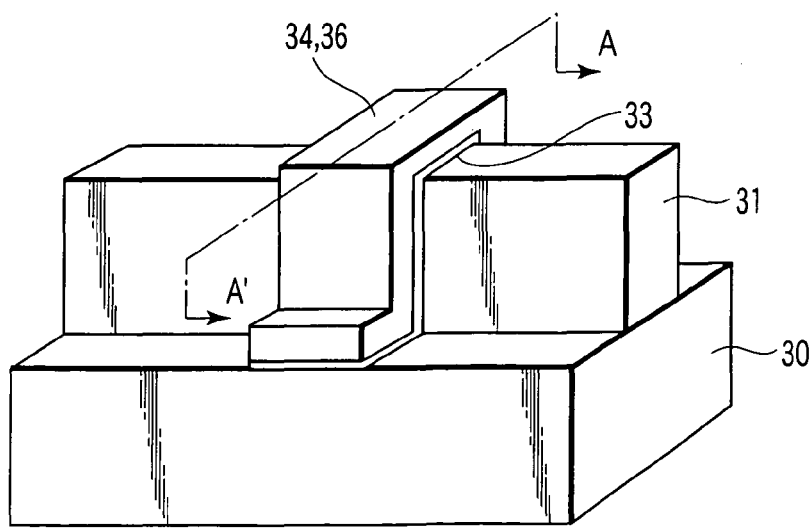
FIG. 23 is a perspective view showing the schematic structure of a fin-type nonvolatile semiconductor memory device according to a seventh embodiment of this invention.

FIG. 23 is a perspective view showing the schematic structure of a fin-type nonvolatile semiconductor memory device according to a seventh embodiment of this invention.

As shown in FIG. 23, the fin-type nonvolatile semiconductor memory is a nonvolatile semiconductor memory having transistors configured on a plate-like element region 31 called a fin and has the effects of miniaturization, high integration density and suppression of the short-channel effect. Further, with the above fin structure, the laminated structure having the silicon nitride film sandwiched between the silicon oxide films configures a tunnel insulating film 33 and the silicon nitride film is formed of a silicon nitride film having 3-coordinate nitrogen bonds aggregated at high density to attain the same effect as that in the first embodiment.

FIGS. 24A to 24H show the manufacturing process of this embodiment. The drawing corresponds to the cross sectional view taken along the A-A' line in FIG. 23.

Figure 24A:
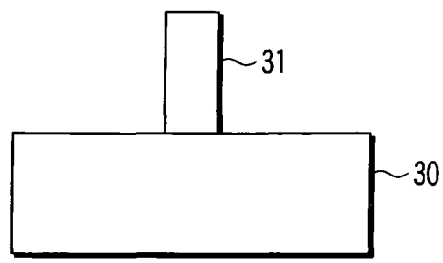
FIGS. 24A to 24H are cross sectional views showing the manufacturing process of the fin-type nonvolatile semiconductor memory device of the seventh embodiment.
Figure 24B:
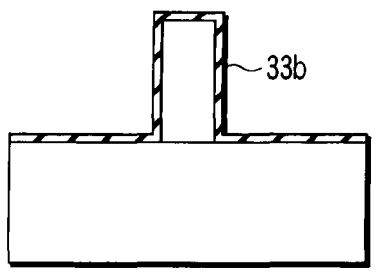
Figure 24C:
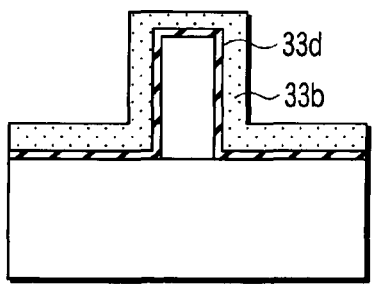

First, as shown in FIG. 24A, a plate-like element region 31 vertically erected and formed on the silicon substrate 30 is oxidized by use of oxygen gas, for example, to form a silicon oxide film 33b with a thickness of approximately 2 nm as shown in FIG. 24B. Then, as shown in FIG. 24C, a flat amorphous silicon film 33d with a thickness of approximately 1 nm is formed by use of disilane gas, for example.

Figure 24D:
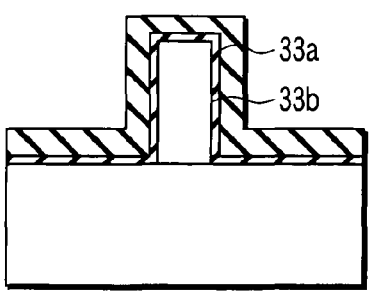

Next, as shown in FIG. 24D, the amorphous silicon film 33d is directly nitrided at a temperature of 700° C. under pressure of 50 Torr by use of a plasma nitriding method, for example, to form a silicon nitride film 33a with a thickness of approximately 2 nm. At this time, for example, nitrogen is used as the gas source for plasma nitriding, but if the nitriding process is performed by use of a mixture of nitrogen and oxygen, a silicon nitride film (a so-called oxynitride film) having oxygen introduced therein can be formed. Further, the oxygen concentration in the silicon nitride film can be controlled to a desired concentration by changing the mixing ratio of the nitriding gas to oxidizing gas.

Figure 24E:
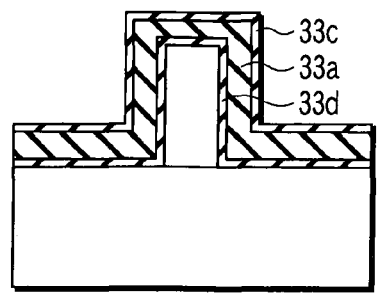
Figure 24F:
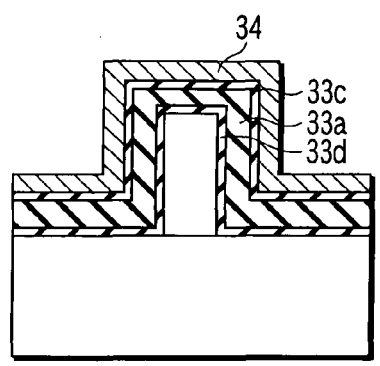

Then, for example, as shown in FIG. 24E, a silicon oxide film 33c with a thickness of approximately 2 nm is formed by performing the oxidizing process by use of oxygen gas, for example. As a result, a tunnel insulating film 33 formed of a silicon nitride film 33a containing oxygen and sandwiched between the silicon oxide films 33b and 33c is formed. After this, as shown in FIG. 24F, an n-type polysilicon film with a thickness of 200 nm having phosphorus doped therein is deposited as a floating gate electrode 34 on the tunnel insulating film 33.

Figure 24G:
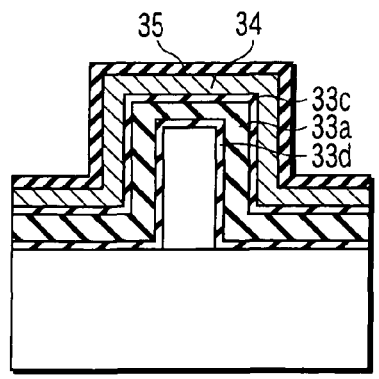
Figure 24H:
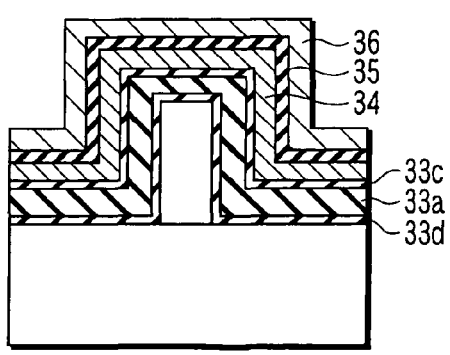

Next, as shown in FIG. 24G, an ONO film 35 with a thickness of 7 nm, for example, is formed on the polysilicon film 34. Then, as shown in FIG. 24H, an n-type polysilicon film with a thickness of 200 nm having phosphorus doped therein is deposited as a control gate electrode 36 on the ONO film 35.

The succeeding process is not shown in the drawing here, but like the other embodiments, the patterning process is performed by use of a resist pattern and then the polysilicon films 36, 34, tunnel insulating film 33 and ONO film 35 are etched by use of the reactive ion etching method to form a gate portion. Further, after the resist mask is removed, the heat treatment is performed in the oxidation atmosphere to restore the condition damaged by the processing and a post-oxidation film with approximately 3 nm is formed. Then, for example, after phosphorus is ion-implanted into the entire surface with the concentration of $3 \times 10^{-15}$ cm$^{-2}$, the heat treatment is performed at 1000° C. for 20 seconds, for example, to diffuse phosphorus into the silicon substrate and activate the same. Thus, diffusion layers used as source and drain regions are formed.

Next, for example, a silicon oxide film with a thickness of 300 nm is deposited on the entire surface by the CVD method and then contact holes are formed in the silicon oxide film by an anisotropic etching process. After this, an aluminum film with a thickness of 800 nm containing silicon and copper of 0.5%, for example, is formed and then it is patterned to form electrodes. Next, the heat treatment is performed at 450° C. for 15 minutes in a nitrogen atmosphere containing hydrogen of 10%.

Thus, according to the present embodiment, a fin-type nonvolatile memory having the tunnel insulating film of high quality and high reliability and attaining the effects of miniaturization, high integration density and suppression of the short-channel effect can be formed. Further, the tunnel insulating film 33 is formed as a tunnel insulating film which suppresses a leak current, and at the same time, the physical film thickness of the tunnel insulating film is set to 6 nm by setting the thickness of the silicon nitride film sandwiched between the silicon oxide films of 2 nm to 2 nm. Thus, the tunnel insulating film itself can be made thin. As a result, the power supply voltage can be lowered and it becomes possible to enhance the characteristic of the device and enhance the reliability thereof.

Eighth Embodiment

FIGS. 25A to 25E are cross sectional views showing the manufacturing process of a nonvolatile semiconductor memory device according to an eighth embodiment of this invention, and more particularly, showing the manufacturing process of a tunnel insulating film. Portions which are the same as those of FIG. 1 are denoted by the same reference symbols and the detail explanation thereof is omitted.

The present embodiment is different from the second embodiment explained before in that a crystalline silicon film is formed instead of formation of the amorphous silicon film used as a basis of formation of the nitride film. In this case, crystalline silicon means that the whole portion of silicon is not in the amorphous state but in the single crystal silicon state, polysilicon state or a state in which crystal grains are combined.

Figure 25A:
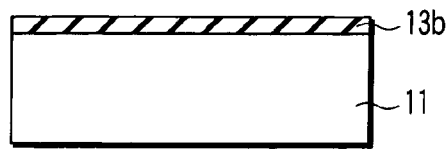
FIGS. 25A to 25E are cross sectional views showing the manufacturing process of a nonvolatile semiconductor memory device according to an eighth embodiment of this invention.
Figure 25B:
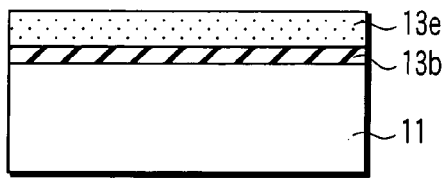

First, as shown in FIG. 25A, a silicon oxide film 13b with a thickness of approximately 2 nm is formed by oxidizing the surface of a silicon substrate 11 by use of oxygen gas, for example. Then, as shown in FIG. 25B, a flat silicon film 13e with a thickness of approximately 1 nm is formed on the silicon oxide film 13b by use of silane gas, for example. The condition at this time is that the temperature is 720° C., the pressure is 275 Torr and film formation time is 0.5 second.

Figure 25C:
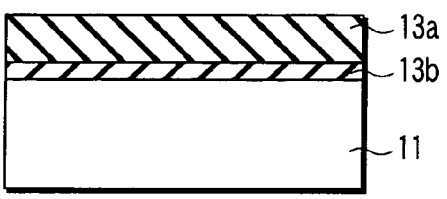

Next, as shown in FIG. 25C, the silicon film 13e is directly nitrided at a temperature of 100° C. under pressure of 0.03 Torr by use of a plasma nitriding method, for example. Thus, a silicon nitride film 13a with a thickness of approximately 1 nm is formed. At this time, for example, nitrogen is used as a gas source for plasma nitriding, but if the nitriding process is performed by use of a mixture of nitrogen and oxygen, a silicon nitride film (a so-called oxynitride film) having oxygen introduced therein can be formed. Further, the oxygen concentration in the silicon nitride film can be controlled to a desired concentration by changing the mixing ratio of the nitriding gas to oxidizing gas.

Figure 25D:
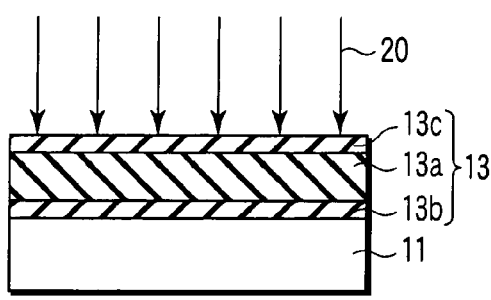
Figure 25E:
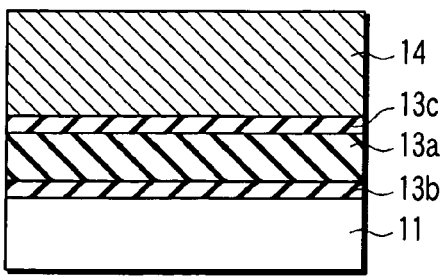

Then, for example, a silicon oxide film 13c with a thickness of approximately 2 nm is formed by oxidizing the surface of the silicon nitride film 13a by use of oxygen gas (oxidizing gas) 20. As a result, as shown in FIG. 25D, a tunnel insulating film 13 formed of the silicon nitride film 13a sandwiched between the silicon oxide films 13b and 13c is formed. After this, as shown in FIG. 25E, an n-type polysilicon film with a thickness of 200 nm having phosphorus doped therein is deposited as a floating gate electrode 14 on the tunnel insulating film 13. Thus, a MOS structure can be formed.

In order to form a silicon nitride film having 3-coordinate nitrogen bonds, it is necessary that the silicon film formed in the step shown in FIG. 25B is a flat and continuous film. If the silicon film is nitrided while it is not formed as a continuous film and silicon islands (cores) are disorderly provided together, a thin region is locally provided and Si atoms which are not nitrided will remain in the nitride film. This is not preferable from the viewpoint of an insulating property. Therefore, as will be described later (as will be explained in detail in a ninth embodiment), the deposition condition of a crystalline silicon film becomes important.

In addition, it is not preferable that the film is set in the polycrystalline state. When Si atoms are set in the polycrystalline state, the nitriding rate of Si in a grain boundary is high, but the nitriding rate of crystal Si in the grain is low. Therefore, there occurs a strong possibility that a crystal Si region which is not nitrided will remain. This means that Si dots remain in the film and it is not preferable from the viewpoint of an insulating property. Therefore, as will be described later (as will be explained in detail in a ninth embodiment), estimation of time required for fully nitriding polycrystalline Si becomes important.

The silicon film can be deposited in a further flat form by increasing the number of dangling bonds of the surface on which the silicon film is deposited. That is, if a step of increasing the number of surface dangling bonds immediately before deposition of silicon is additionally provided in the course of depositing silicon, an insulating film which is excellent in the degree of flatness and insulating property can be formed. The above effect will be explained in detail in the ninth embodiment which will be described later.

In the present embodiment, the silicon film similar to a single crystal film can be formed as a continuous film in a flat form by depositing silicon for 0.5 second or more in a condition of the temperature of 720° C. and pressure of 275 Torr. Then, by nitriding the flat silicon film in the above condition, the silicon nitride film having the 3-coordinate nitrogen bonds at high concentration can be formed like the case of the second embodiment. Therefore, in the present embodiment, the same effect as that of the second embodiment can be attained.

Ninth Embodiment

FIGS. 26A to 26E are cross sectional views showing the manufacturing process of a nonvolatile semiconductor memory device according to a ninth embodiment of this invention, and more particularly, showing the manufacturing process of a tunnel insulating film. Portions which are the same as those of FIG. 1 are denoted by the same reference symbols and the detail explanation thereof is omitted.

The present embodiment is different from the eighth embodiment explained before in that the process of depositing and nitriding a crystalline silicon film is repeatedly performed to form a silicon nitride film with sufficiently large film thickness.

Figure 26A:
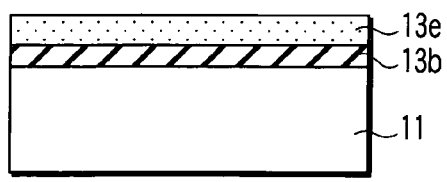
FIGS. 26A to 26E are cross sectional views showing the manufacturing process of a nonvolatile semiconductor memory device according to a ninth embodiment of this invention.

First, as shown in FIG. 26A, a silicon oxide film 13b with a thickness of approximately 2 nm is formed by oxidizing the surface of a silicon substrate 11 by use of oxygen gas, for example. Then, a silicon film 13e is formed on the silicon oxide film 13b by use of silane gas, for example. At this time, a chamber in which both of the film formation process by CVD and the nitriding process can be performed is used and the substrate 11 is disposed inside the chamber to form the silicon film 13e. Specifically, $SiH_4$ is used as material gas, the gas pressure in the chamber is set at 275 Torr, the substrate temperature is set at 720° C. and film formation time is set to 1 second. As a result, the silicon film 13e with a thickness of 1 nm is deposited on the surface of the silicon oxide film 13b.

Figure 26B:
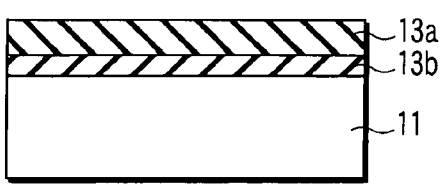

Next, $NH_3$ at 3 Torr is used as the atmosphere in the chamber, the surface temperature of the silicon film 13e is set to 700° C. by controlling the heater and this state is maintained for 200 seconds. Then, as shown in FIG. 26B, a silicon nitride film 13a with a thickness of 1.3 nm is formed.

Figure 26C:
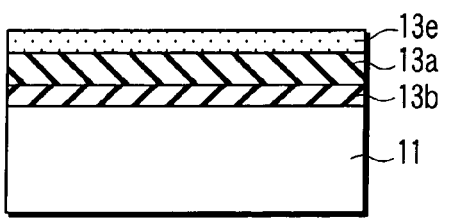

Next, as shown in FIG. 26C, silane gas is used again to form a silicon film 13e on the silicon nitride film 13a. At this time, $SiH_4$ is used as material gas, the gas pressure in the chamber is set at 275 Torr, the substrate temperature is set at 720° C. and film formation time is set to 0.5 second. As a result, a silicon film 13e with a thickness of 1 nm is deposited on the surface of the silicon oxide film 13b.

Figure 26D:
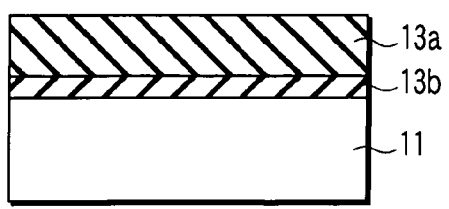

Next, as shown in FIG. 26D., the silicon film 13e is converted into a nitride film by performing the nitriding process at the temperature of 700° C. for 200 seconds like the above case and the film thickness of the silicon nitride film 13a is increased by 1.2 nm. At this time, a silicon nitride film with approximately 6 nm can be formed by repeatedly performing the steps of FIGS. 26C and 26D by five times, for example. That is, by repeatedly performing the steps shown in FIGS. 26C and 26D by plural times, a silicon nitride film having 3-coordinate nitrogen bonds at high density can be formed to necessary film thickness.

In the present embodiment, the silicon film forming process and nitriding process are performed in the same chamber, but they can be performed in independent chambers. In this case, the film formation chamber and nitriding chamber are arranged in adjacent positions and the two chambers are connected in an airtight fashion.

Figure 26E:
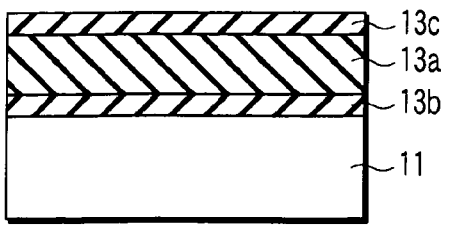

Next, like the former embodiment, as shown in FIG. 26E, for example, the surface of the silicon nitride film 13a is oxidized by use of oxygen gas (oxidizing agent) 20 to form a silicon oxide film 13c with a thickness of approximately 2 nm. Thus, a tunnel insulating film 13 formed of the silicon nitride film 13a sandwiched between the silicon oxide films 13b and 13c is formed. After this, like the former embodiment, a MOS structure can be formed by forming a floating gate electrode 14 on the tunnel insulating film 13.

It should be noted in this embodiment that the silicon film is formed in a flat and continuous form in the steps shown in FIGS. 26A and 26C. If the nitriding process is performed while the silicon film is not formed as a continuous film and silicon islands (cores) are disorderly provided together and the depositing and nitriding steps are repeatedly performed, then a film with irregular thickness is formed. This causes a thin region to be locally provided and it is not preferable from the viewpoint of an insulating property.

In addition, the polycrystalline state is not preferable. When Si atoms are set in the polycrystalline state, the nitriding rate of Si in a grain boundary is high, but the nitriding rate of crystal Si in the grain is low. Therefore, there occurs a strong possibility that a crystal Si region which is not nitrided will remain. This is not preferable from the viewpoint of an insulating property. Therefore, as will be described later, estimation of time required for completely nitriding polycrystalline Si becomes important.

Figure 27:
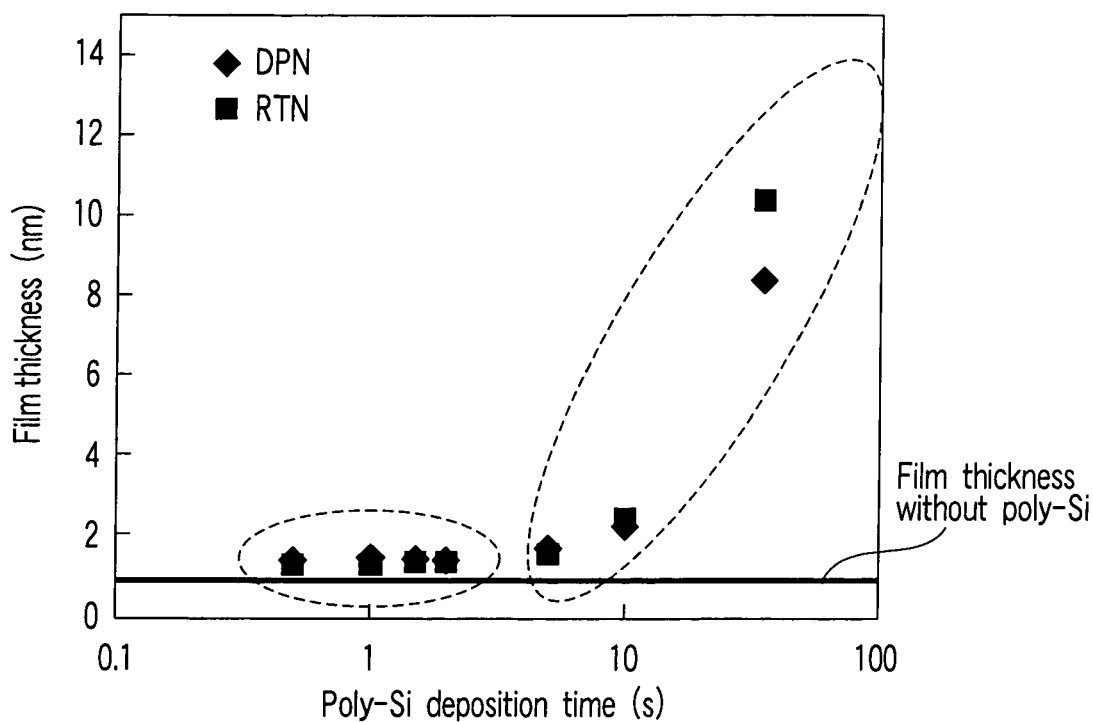
FIG. 27 is a diagram showing a variation in the film thickness of nitride films formed when polysilicon films of different deposition times are subjected to a nitriding process in the same condition.

FIG. 27 shows a variation in the film thickness of a nitride film formed when a silicon film is formed on the silicon substrate by changing deposition time and then subjected to a nitriding process at 700° C. for 1000 seconds. It is understood that the film thickness starts to increase when the deposition time exceeds approximately 0.5 second and the film thickness rapidly increases when the deposition time exceeds approximately 5 seconds. This is based on the following reason.

The reason why an increase in the film thickness of the nitride film cannot be observed in the deposition time of less than 0.5 second is that silicon is not deposited or a continuous silicon film is not formed in the deposition time of less than 0.5 second. The reason why the film thickness of the nitride film starts to increase when the deposition time exceeds approximately 0.5 second is that silicon is deposited to form a continuous film and is set not in the polycrystalline state but in the single crystal state (in the same state as bare silicon) when the deposition time exceeds approximately 0.5 second. Further, the reason why the film thickness rapidly increases when the deposition time exceeds approximately 5 seconds is that polysilicon is deposited on single crystal silicon when the deposition time exceeds approximately 5 seconds. That is, since the nitriding rate of polysilicon is high, the film thickness of the nitride film rapidly increases when the deposition time exceeds approximately 5 seconds. The tendency is the same when the background is formed of a silicon oxide film or silicon nitride film.

Therefore, whether or not silicon is deposited to form a continuous film or whether or not polysilicon is deposited can be checked by observing the above tendency. That is, in this case, silicon may be deposited in the time range of 0.5 second to 5 seconds. Likewise, when a silicon film is deposited on a nitride film, silicon may be deposited in the time range of 0.5 second to 5 seconds. Further, when a silicon film is deposited on an oxide film, silicon may be deposited in the time range of 5 seconds to 7 seconds.

It should be further noted in the present embodiment that a polysilicon film is completely nitrided even when the polysilicon film is formed in the steps shown in FIGS. 26B and 26D. By completely nitriding the polysilicon film, a network of silicon and nitrogen is formed, the density of the 3-coordinate nitrogen bonds can be enhanced and a highly reliable nitride film having less defects can be formed.

In a process of nitriding polysilicon on the silicon substrate, the nitriding rate is first set high and becomes low at a certain time. That is, "a region in which the nitriding rate is high" and "a region in which the nitriding rate is low" are provided in the relation between the nitriding time and the film thickness to be formed. The "region in which the nitriding rate is high" is "a region in which nitrization of polysilicon having a high nitriding rate occurs" and the "region in which the nitriding rate is low" is "a region in which polysilicon is completely nitrided and nitrization of single crystal silicon having a low nitriding rate occurs". Therefore, time required for completely nitriding polysilicon can be acquired by observing the above relation.

Figure 28:
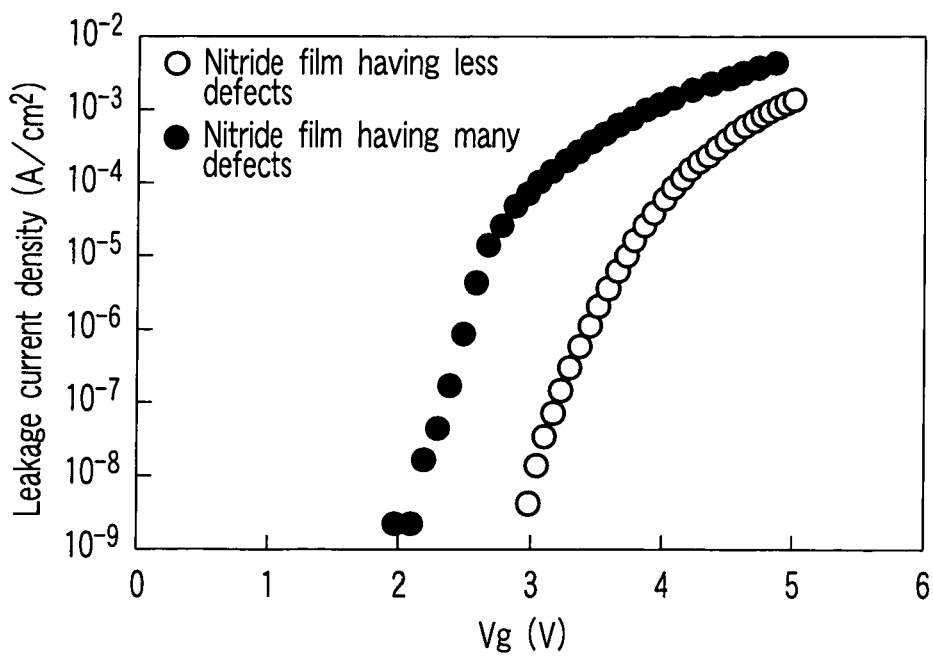
FIG. 28 is a characteristic diagram showing the difference in the SILC characteristic according to the formation condition of a nitride film.

FIG. 28 shows a difference in the SILC characteristic depending on a nitride film formation condition. As shown in the present embodiment, it is understood that a leak current in a low-voltage region is more rapidly reduced in a film formed by plasma-nitriding the silicon substrate in a condition of 700° C. and 3 Torr and having less defects than in a film formed by plasma-nitriding the silicon substrate at room temperature and having more defects. This is because occurrence of defects is suppressed by forming a network of Si and N and the number of leak paths in the bulk is reduced.

Figure 29:
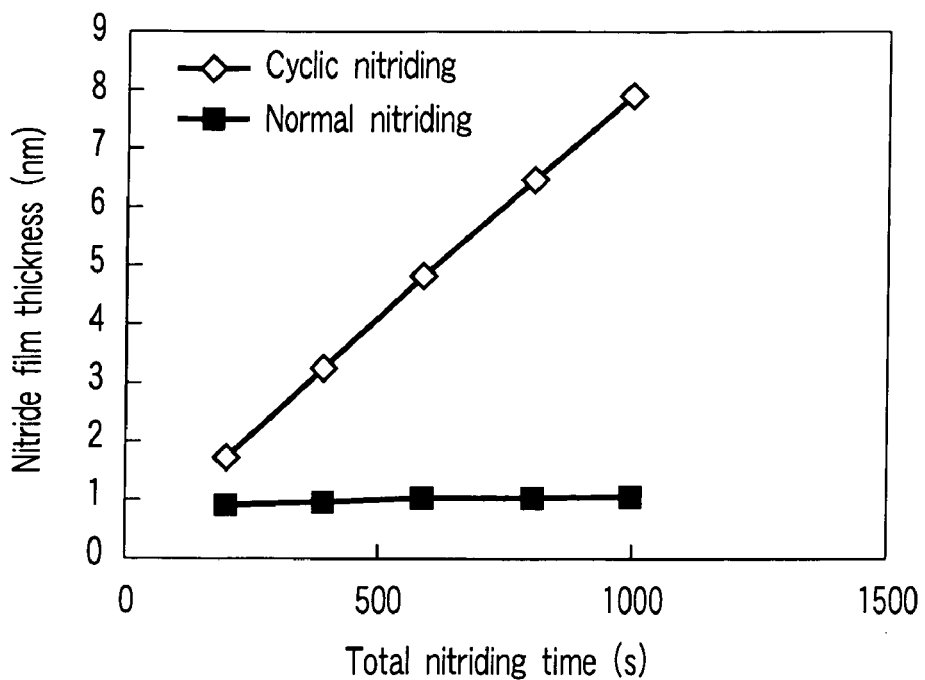
FIG. 29 is a characteristic diagram showing the relation between nitriding time and nitride film thickness.

FIG. 29 shows the nitride film thickness attained in a case where the process of nitriding the silicon substrate for 200 seconds is repeatedly performed five times (normal nitriding) without depositing silicon after the silicon substrate is nitrided at 700° C. for 100 seconds in comparison with the nitride film thickness attained in a case where the process of nitriding the silicon substrate for 200 seconds is repeatedly performed five times (cycle nitriding) after silicon is deposited for one second. It is understood that the physical film thickness can be made larger by 4 nm or more by depositing silicon even if the film formation time is set to the same. The difference is caused by making it more difficult for nitrogen to pass through the nitride film as the nitride film becomes thicker. By performing the process of depositing and nitriding silicon on the nitride film, nitrogen can always react with silicon even if it does not diffuse into the nitride film. This is the reason why the film thickness can be made large even when the same film formation time is used.

Figure 30:
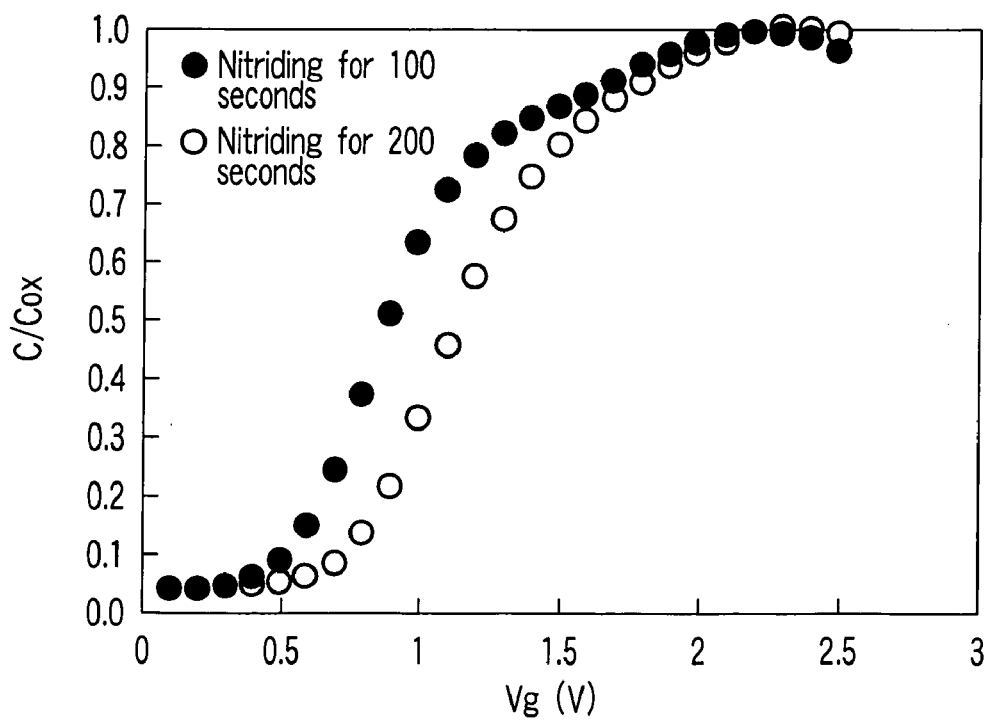
FIG. 30 is a diagram showing a variation in the characteristic of a nitride film according to a difference in the nitriding time.

The nitriding time is set to 200 seconds, but it can be set longer. The important thing is that silicon deposited on the nitride film is completely nitrided. FIG. 30 shows the characteristic of a nitride film when silicon is deposited for one second and nitrided for 100 seconds after the silicon substrate is nitrided at 700° C. for 100 seconds in comparison with the characteristic of a nitride film when silicon is nitrided for 200 seconds. In the case of nitriding for 100 seconds, it is understood that a CV curve is shifted to the negative side. This is because a large amount of defects are present in the film since silicon is not completely nitrided when the nitriding time is not sufficiently long.

The silicon deposition time is set to one second, but it can be made longer. However, time required for fully nitriding silicon is required to be made longer accordingly. FIG. 31 shows deposition time of silicon (single crystal silicon and polysilicon) and time required for completely nitriding the same. It is understood that time required for completely nitriding silicon becomes markedly long as the deposition film thickness is made larger. This is because nitrogen must diffuse through a thick nitride film to completely nitride silicon when the silicon film becomes thick even if silicon is set in a polycrystalline state. Therefore, in order to form a thick film, it is efficient to repeatedly perform a process of depositing a thin polysilicon film and quickly and fully nitriding the same.

In this case, deposition and nitriding of crystalline silicon can be rapidly switched by performing film formation and nitriding of crystalline silicon in the same chamber as in the present embodiment. One deposition step of crystalline silicon can be performed in an extremely short period of time, for example, several seconds. Therefore, unlike the normal nitriding, even if the number of switching operations of film formation and nitriding of crystalline silicon is increased and time required for the switching operation is additionally taken, the total processing time can be made shorter in the cycle nitriding process.

Further, silicon deposition time should not be set excessively short. For silicon deposition, incubation time becomes important. That is, if deposition time is shorter than the incubation time, it indicates that silicon is not deposited or silicon does not form a continuous film. In this case, "formation of the continuous film" indicates "a state in which the background (silicon oxide film) having a film deposited thereon is not exposed". FIG. 32 shows the ratio of incubation times of silicon on the oxide film, Si and nitride film. It is understood that the incubation time becomes shorter in an order of oxide film→Si→nitride film. The reason why the incubation time is different depending on the surfaces of respective types of films is that the number of dangling bonds present in the surface thereof is different.

The film thickness of silicon which forms a continuous film is different depending on the number of dangling bonds (bonds which are not connected) of the surface on which silicon is deposited. Time until the continuous film is formed becomes shorter in a case where a silicon film is formed on a nitride film ($Si_3N_4$) than on Si. This is because the number of dangling bonds of the surface of the nitride film is larger than that on the Si surface. Time until the continuous film is formed becomes longer in a case where a film is formed on an oxide film ($SiO_2$) than on Si. This is because the number of dangling bonds of the surface of the oxide film is smaller than that of the Si surface.

When the dangling bonds of the surface are less, a film is grown through the growing process called a Volmer-Weber type. In the Volmer-Weber type, a plurality of atoms are condensed to form cores on the substrate and flying atoms are sequentially concentrated to grow the cores in a 3-dimensional form. The cores (islands) grow and are combined as the vaporization process is performed and they form a continuous film. When the interaction between the vaporization atoms is stronger than that between the vaporization atom and the substrate atom, the above growing process is performed.

When the number of dangling bonds is large, a film is grown through a growing process called a Stranski-Krastanov type (a film is grown in a single-layered (or plural-layered) form on the substrate and then 3-dimensional cores are formed and grown thereon). That is, when a large number of dangling bonds are present on the surface, a continuous film can be easily formed from the beginning. Therefore, time required for depositing silicon to form the continuous film is different depending on the type of the surface.

Based on the relation shown in FIG. 32, time required for deposition is different in a case where the silicon film 13e is deposited in the step shown in FIG. 26A and in a case where the silicon film 13e is deposited in the step shown in FIG. 26C. In this embodiment, approximately 5 seconds is set when the silicon film 13e is deposited on the silicon oxide film 13b and approximately 0.5 second is set when the silicon film 13e is deposited on the silicon nitride film 13a.

Figure 33:
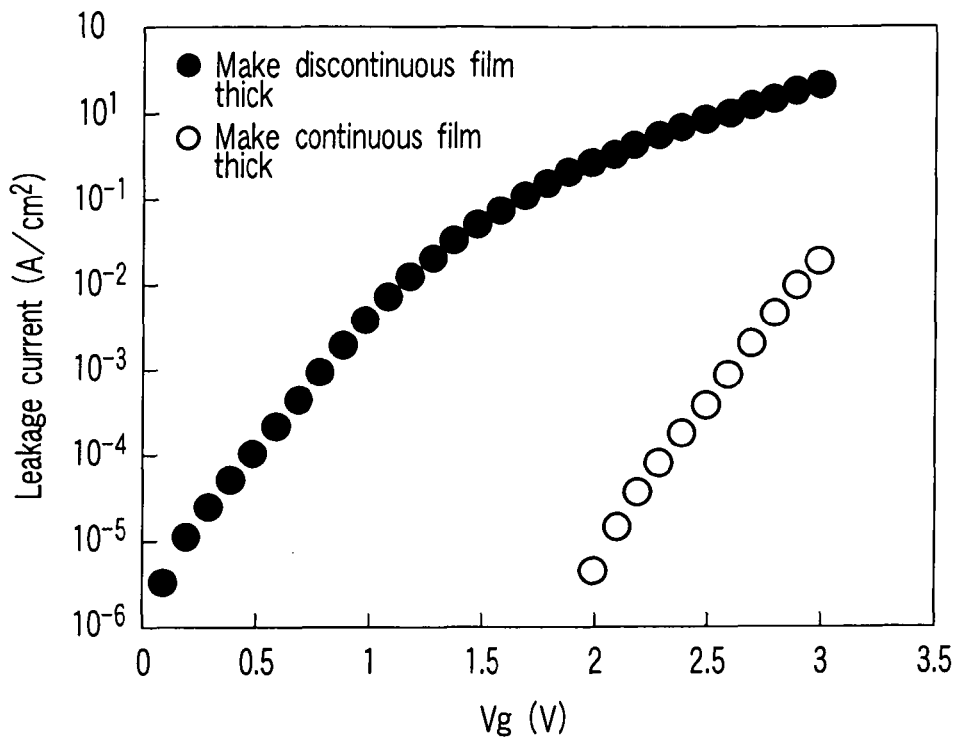
FIG. 33 is a diagram showing the insulation characteristics of nitride films which are different depending on whether a polysilicon film before nitriding is continuous or discontinuous.

Within the time period shorter than the incubation time, silicon is not deposited or a continuous film is not formed. FIG. 33 shows the characteristic obtained when silicon is repeatedly deposited five times to increase the film thickness. In each case, the film thickness is set to 3 nm. It is understood that the insulating property of a nitride film formed by repeatedly performing a process of depositing silicon for 0.1 second in a discontinuous film state and nitriding silicon to increase the film thickness is markedly lowered in comparison with that of a nitride film formed by repeatedly performing a process of depositing silicon for 0.5 second to form a continuous film and nitriding silicon. This is because a region with small film thickness is provided since the film is made thick without forming a continuous film.

Figure 34:
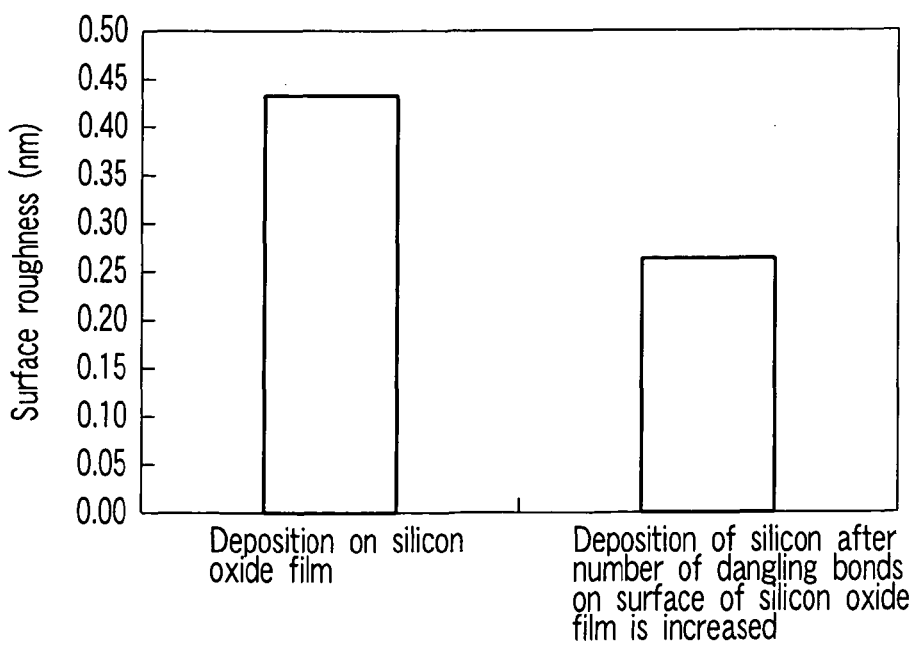
FIG. 34 is a diagram showing a variation in the surface roughness when silicon is deposited on the silicon oxide film and when silicon is deposited after dangling bonds are formed in the surface of the silicon oxide film.

That is, silicon can be deposited in a flat form by increasing the number of dangling bonds of the surface on which silicon is deposited. FIG. 34 shows a variation in the surface roughness when silicon is deposited on the silicon oxide film and when silicon is deposited after the surface of the silicon oxide film is plasma-nitrided for 5 seconds by use of a power of 100 W under 0.08 Torr in a He atmosphere which is diluted to 40% by use of $N_2$ (after dangling bonds are formed on the surface). It is understood that the degree of surface roughness of silicon becomes low by nitriding the surface of the silicon oxide film. This is because the number of dangling bonds of the surface of the silicon oxide film is increased by nitriding and the growing process of silicon is changed from the Volmer-Weber type to the Stranski-Krastanov type. Therefore, if a step of increasing the number of surface dangling bonds immediately before depositing silicon is added in the course of depositing silicon, an insulating film having excellent flatness and insulating property can be formed. As one example, the plasma-nitriding process is provided.

As described above, a silicon nitride film having 3-coordinate nitrogen bonds at high density can be made thick by repeatedly performing the process of depositing and nitriding silicon. Thus, a thick nitride film can be formed in a short period of time by setting adequate silicon deposition time and nitriding time.

In the present embodiment, the film formation temperature of crystalline silicon is set at 720° C., silane is used as the material gas and the gas pressure is set at 275 Torr, but the above condition can be adequately changed. For example, the temperature is preferably set in the range of 550° C. to 1050° C. as the temperature condition.

$NH_3$ is used as nitrogen gas used at the time of the nitriding process, but the nitriding process can be performed by using another gas containing nitrogen. The nitriding temperature is set at 700° C., but the nitriding process can be performed by using other temperatures. Further, the nitriding pressure is set at 3 Torr, but the nitriding process can be performed at different pressure. For example, the temperature is preferably set in the range of 6000° C. to 8500° C. as the temperature condition at the time of the nitriding process. Further, the gas pressure is preferably set at 100 Torr or less.

The number by which the step of depositing crystalline silicon on the nitride film and nitriding the same is not limited to five times and can be set to any number of times. Further, after polysilicon is deposited on the nitride film, the silicon film can be oxidized by use of gas containing oxygen.

Tenth Embodiment

FIGS. 35A to 35E are cross sectional views showing the manufacturing process of a nonvolatile semiconductor memory device according to a tenth embodiment of this invention, and more particularly, showing the manufacturing process of a tunnel insulating film. Portions which are the same as those of FIG. 1 are denoted by the same reference symbols and the detail explanation thereof is omitted.

The present embodiment is different from the ninth embodiment explained before in that amorphous silicon is used instead of crystalline silicon and the other basic process is the same.

Figure 35A:
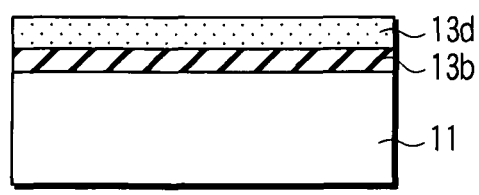
FIGS. 35A to 35E are cross sectional views showing the manufacturing process of a nonvolatile semiconductor memory device according to a tenth embodiment of this invention.

First, as shown in FIG. 35A, the surface of a silicon substrate 11 is oxidized by use of oxygen gas, for example, to form a silicon oxide film 13b with a thickness of approximately 2 nm. Then, an amorphous silicon film 13d is formed on the silicon oxide film 13b by use of silane gas, for example. In this example, a chamber in which both of the film formation process by CVD and the nitriding process could be performed was used and the amorphous silicon film 13d was formed with the substrate 11 arranged in the chamber. Specifically, $Si_2H_6$ was used as material gas, the gas pressure in the chamber was set at 1 Torr, the substrate temperature was set at 400° C. and the film formation time was set to 40 minutes. As a result, the amorphous silicon film 13d with a thickness of 2 nm was deposited on the surface of the silicon oxide film 13b.

Figure 35B:
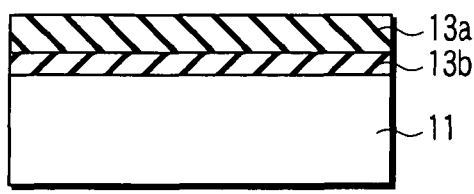

Next, $NH_3$ of 3 Torr, for example, is used as the atmosphere in the chamber, a heater is controlled to set the surface temperature of the amorphous silicon film 13d to 700° C. and this state is maintained for 300 seconds or longer. Thus, as shown in FIG. 35B, a silicon nitride film 13a with a thickness of 2.2 nm is formed.

Figure 35C:
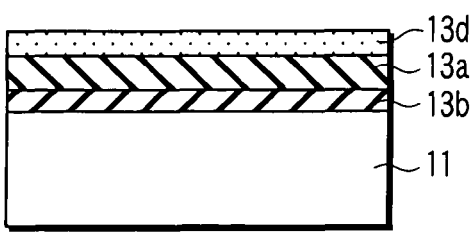

Next, as shown in FIG. 35C, an amorphous silicon film 13d is formed on the silicon nitride film 13a by use of silane gas again. In this example, $Si_2H_6$ was used as material gas, the gas pressure in the chamber was set at 1 Torr, the substrate temperature was set at 400° C. and the film formation time was set to 40 minutes. As a result, the amorphous silicon film 13d with a thickness of 2 nm was deposited on the surface of the silicon oxide film 13b.

Figure 35D:
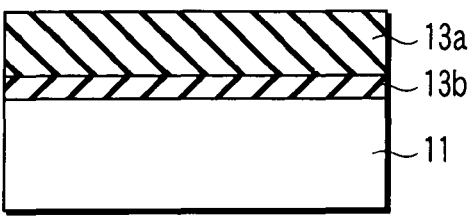

After this, as shown in FIG. 35D, like the above case, the amorphous silicon 13d is converted into a nitride film by performing the nitriding process at 700° C. for 300 seconds and the film thickness of the silicon nitride film 13a is increased by 2.2 nm. At this time, a silicon nitride film with required film thickness can be obtained by repeatedly performing the steps shown in FIGS. 35C and 35D.

In the present embodiment, the amorphous silicon film formation process and nitriding process are performed in the same chamber, but the processes may be performed in independent chambers. In this case, the film formation chamber and nitriding chamber are arranged adjacent to each other and both of the chambers may be connected in an airtight fashion.

Figure 35E:
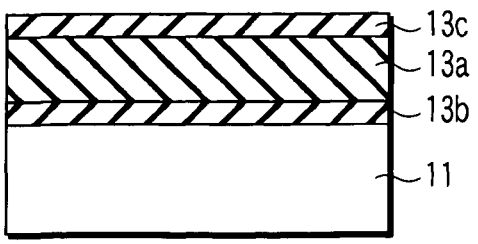

Next, like the former embodiment, as shown in FIG. 35E, the surface of the silicon nitride film 13a is oxidized by use of, for example, oxygen gas (oxidizing agent) 20 to form a silicon oxide film 13c with a thickness of approximately 2 nm. Thus, a tunnel insulating film 13 formed of the silicon nitride film 13a sandwiched between the silicon oxide films 13b and 13c is formed. After this, like the former embodiment, a MOS structure can be formed by forming a floating gate electrode 14 on the tunnel insulating film 13.

Also, in the present embodiment, like the ninth embodiment, it is important to make the amorphous silicon film in a flat and continuous form in the steps shown in FIGS. 35A and 35C. Further, it is important to completely nitride the amorphous silicon film in the steps shown in FIGS. 35B and 35D. The condition to satisfy the above requirements may be set to substantially the same condition as that of the ninth embodiment, but it is necessary to set the temperature at the time of formation of the amorphous silicon film lower than that in the ninth embodiment so as to prevent occurrence of crystallization. For example, it is preferable to set the temperature condition in a range of 300° C. to 550° C.

Also, in the present embodiment, the tunnel insulating film 13 having the structure in which the silicon nitride film is sandwiched between the silicon oxide films 13b and 13c can be formed and the silicon nitride film 13a having 3-coordinate nitrogen bonds at high density can be formed with sufficiently large thickness. Therefore, the same effect as that of the ninth embodiment can be obtained.

Eleventh Embodiment

Figure 36:
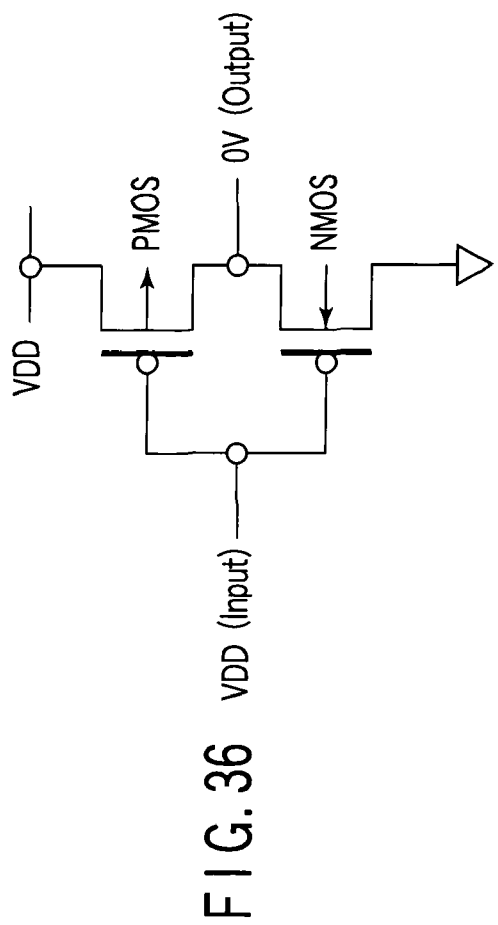
FIG. 36 is an equivalent circuit diagram showing the circuit configuration of a CMOS semiconductor device according to an eleventh embodiment of this invention.
Figure 37:
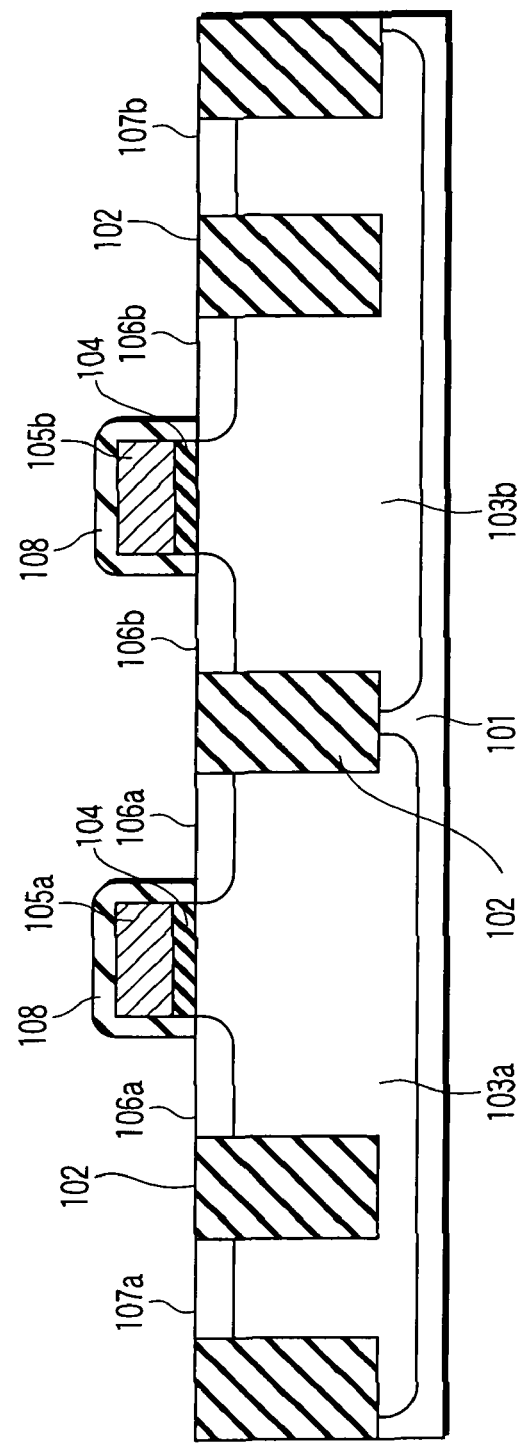
FIG. 37 is a cross sectional view showing the schematic element structure of the CMOS semiconductor device according to the eleventh embodiment.

FIGS. 36 and 37 illustrate a CMOS semiconductor device according to an eleventh embodiment of this invention, FIG. 36 is an equivalent circuit diagram and FIG. 37 is a cross sectional view of the element structure. In this case, a CMOS inverter with the simplest configuration is explained as an example.

As shown in FIG. 36, the CMOS inverter has a configuration in which a p-type MOSFET and an n-type MOSFET are serially connected. It is a circuit which outputs 0V when the diffusion layer on one side of the n-type MOSFET is grounded, drive voltage is applied to the diffusion layer on one side of the p-type MOSFET and drive voltage is applied to the gate electrodes of the p-type and n-type MOSFETs as an input.

In the present embodiment, as shown in FIG. 37, a silicon thermal oxide film (element isolation insulating film) 102 for element isolation is embedded in and formed on a p-type silicon substrate 101. A p-type well region 103a is formed on the n-type MOSFET side by ion-implanting boron and an n-type well region 103b is formed on the n-type MOSFET side by ion-implanting phosphorus on the surface of the silicon substrate 101. Well electrodes 107a, 107b are respectively formed on the well regions 103a, 103b. Further, n-type source and drain diffusion layers 106a are formed on the well region 103a by ion-implanting phosphorus and p-type source and drain diffusion layers 106b are formed on the well region 103b by ion-implanting $BF_2$.

Further, gate insulating films 104 which are each formed of a laminated layer structure having a silicon nitride film sandwiched between silicon oxide films are formed on the surface of the silicon substrate 101. The gate insulating film 104 has a structure shown in FIG. 2, for example. That is, the silicon nitride film sandwiched between the silicon oxide films is a film which is continuous in the in-plane direction and the bonding state of nitrogen in the silicon nitride film is a 3-coordinate bond.

On the respective gate insulating films 104, an n-type polysilicon film 105a and p-type polysilicon film 105b which are used as gate electrodes are respectively formed on the n-type MOSFET side and p-type MOSFET side. Further, silicon oxide films 108 are respectively formed on the surroundings of the gate portions.

In the CMOS semiconductor device thus configured, the gate insulating film 104 has a laminated structure of the silicon oxide film/silicon nitride film/silicon oxide film. Therefore, occurrence of defects or charge traps caused in the film at time of application of voltage can be suppressed more effectively in comparison with a case wherein the conventional silicon oxide film or oxide-nitride film (oxynitride film) is used. Therefore, enhancement of the long reliability of a circuit containing the CMOS inverter can be attained and deterioration in the characteristic due to degradation thereof can be suppressed.

FIG. 38 is a diagram showing the characteristic of the CMOS inverter according to the present embodiment in comparison with the characteristic of the conventional CMOS inverter. In this case, the negative bias temperature instability of the p-type MOSFET is taken as an example.

The negative bias temperature instability is the degree of reliability with which the threshold voltage of a transistor is shifted when the transistor is left as it is under high temperatures while negative bias is applied to the p-type gate electrode and an inverted layer is formed. In the case of the CMOS inverter, deterioration that the switching characteristic becomes low occurs. It is known that the nitrogen concentration of a portion near the interface of the silicon substrate increases in the conventional method and deterioration becomes significant, particularly, when the nitrogen concentration becomes high.

According to FIG. 38, it is understood that the service life of a gate insulating film of high quality according to the present embodiment, that is, a gate insulating film having substantially the same nitrogen concentration and having a silicon nitride film in which formation of defects is suppressed and which is sandwiched between silicon oxide films is made longer by two order in comparison with that of the conventional gate insulating film formed of an oxide-nitride film containing nitrogen with high concentration of approximately 30%. This is attained by the following reason. That is, in the conventional structure, the threshold voltage is shifted by formation of the interface level by stress application and capture of holes into defects in the film. On the other hand, in the structure of the present embodiment, since the silicon oxide film containing no nitrogen is disposed on the silicon substrate interface and the silicon nitride film of high quality in which formation of defects is suppressed in the film is used, formation of the interface level and capture of holes in the film can be suppressed.

(Modification)

This invention is not limited to the above embodiments. In the embodiments, the silicon substrate is used, but another semiconductor substrate can be used.

Further, in the step of forming the first gate insulating film, the nitriding temperature and pressure can be adequately changed when an amorphous silicon film is nitrided to form a silicon nitride film. However, in order to attain 3-coordinate nitrogen bonds which are continuous in the in-plane direction, it is preferable to set the temperature lower than 800° C. Further, it is desirable to set the pressure lower than 13300 Pa when the temperature is set equal to or higher than 800° C. When the crystalline silicon film is nitrided to form a silicon nitride film, it is preferable to set the temperature in a range of 500° C. to 850° C. and set the pressure equal to or lower than 40 Torr. When a cyclic nitriding process is performed, the number of repetitive processes can be adequately changed according to a condition such as required nitride film thickness.

When a single-layered film is used as the second gate insulating film, an insulating film having the dielectric constant larger than that of the silicon oxide film is preferably used in order to increase the coupling ratio of the control gate electrode and the floating gate electrode. For example, it is desirable to use a metal oxide film, metal silicate film or metal aluminate film. Further, a material of the control gate electrode and floating gate electrode is not limited to polysilicon and it is possible to use another conductive material.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A manufacturing method of a nonvolatile semiconductor memory device, comprising:
    forming a tunnel insulating film including a three-layered structure in which a silicon nitride film is sandwiched between a first silicon oxide film and a second silicon oxide film, the forming of the tunnel insulating film including:
        oxidizing a surface of a silicon layer to form the first silicon oxide film,
        depositing an amorphous silicon film on the first silicon oxide film,
        nitriding the amorphous silicon film to form the silicon nitride film, and
        forming the second silicon oxide film on the silicon nitride film;
    forming a floating gate electrode on the tunnel insulating film;
    forming an inter-poly insulating film on the floating gate electrode;
    forming a control gate electrode on the inter-poly insulating film; and
    forming a gate portion by etching a laminated film of the floating gate electrode, the control gate electrode, the tunnel insulating film, and the inter-poly insulating film into a gate pattern,
    wherein the surface of the silicon nitride film is oxidized to form the second silicon oxide film on the silicon nitride film, the silicon nitride film is subjected to heat treatment before the second silicon oxide film is formed, and the heat treatment to which the silicon nitride film is subjected before the second silicon oxide film is formed is performed at temperatures not lower than the nitride film formation temperature.

2. The method according to claim 1, wherein the amorphous silicon film is formed at temperatures lower than 550° C. to deposit the amorphous silicon film on the first silicon oxide film.

3. The method according to claim 1, wherein the amorphous silicon film is nitrided in a condition of temperatures lower than 800° C. or conditions of temperatures not lower than 800° C. and pressure not higher than 13300 Pa to form the silicon nitride film by nitriding the amorphous silicon film.

4. The method according to claim 1, wherein an amorphous silicon film is formed on the silicon nitride film and then the amorphous silicon film is oxidized to form the second silicon oxide film on the silicon nitride film.

5. The method according to claim 1, wherein the depositing and the nitriding of the amorphous silicon film are repeatedly performed plural times to form the silicon nitride film.

6. The method according to claim 5, wherein the depositing and the nitriding of the amorphous silicon film are performed in a same chamber.

7. The method according to claim 1, wherein the amorphous silicon film is nitrided in a condition such that the nitriding temperature is set in a range of 600° C. to 1000° C. and the nitriding pressure is set in a range of $10^{-1}$ Torr and 100 Torr.

8. A manufacturing method of a nonvolatile semiconductor memory device, comprising:
    forming a tunnel insulating film including a three-layered structure in which a silicon nitride film is sandwiched between a first silicon oxide film and a second silicon oxide film, the forming of the tunnel insulating film including:
        oxidizing a surface of a silicon layer to form the first silicon oxide film,
        depositing a crystalline silicon film on the first silicon oxide film,
        nitriding the crystalline silicon film to form the silicon nitride film, and
        forming the second silicon oxide film on the silicon nitride film;
    forming a floating gate electrode on the tunnel insulating film;
    forming an inter-poly insulating film on the floating gate electrode;
    forming a control gate electrode on the inter-poly insulating film; and
    forming a gate portion by etching a laminated film of the floating gate electrode, the control gate electrode, the tunnel insulating film, and the inter-poly insulating film into a gate pattern,
    wherein the surface of the silicon nitride film is oxidized to form the second silicon oxide film on the silicon nitride film, the silicon nitride film is subjected to heat treatment before the second silicon oxide film is formed, and the heat treatment to which the silicon nitride film is subjected before the second silicon oxide film is formed is performed at temperatures not lower than the nitride film formation temperature.

9. The method according to claim 8, wherein the crystalline silicon film is formed in a temperature range of 550° C. to 1050° C. to deposit the crystalline silicon film on the first silicon oxide film.

10. The method according to claim 8, wherein the crystalline silicon film is formed in a range of 0.5 second to 5 seconds to deposit the crystalline silicon film on the first silicon oxide film.

11. The method according to claim 8, wherein the surface of the first silicon oxide film is plasma-nitrized after the first silicon oxide film is formed and before the crystalline silicon film is deposited on the first silicon nitride film.

12. The method according to claim 8, wherein a deposition process of the crystalline silicon film is performed for a period of time longer than incubation time required for making the crystalline silicon film continuous to deposit the crystalline silicon film on the first silicon oxide film.

13. The method according to claim 8, wherein the depositing and the nitriding of the crystalline silicon film are repeatedly performed plural times to form the silicon nitride film.

14. The method according to claim 13, wherein the depositing and the nitriding of the crystalline silicon film are performed in the same chamber.

* * * * *